United States Patent
Brill et al.

(10) Patent No.: US 8,024,065 B2
(45) Date of Patent: Sep. 20, 2011

(54) METHODS AND APPARATUS FOR TRANSFERRING A SUBSTRATE CARRIER WITHIN AN ELECTRONIC DEVICE MANUFACTURING FACILITY

(75) Inventors: Todd J. Brill, Round Rock, TX (US); Michael Teferra, Los Gatos, CA (US); Amitabh Puri, San Jose, CA (US); Daniel R. Jessop, Eagle Mountain, UT (US); Glade L. Warner, Sandy, UT (US); David C. Duffin, Sandy, UT (US)

(73) Assignee: Applied Materials, Inc., Santa Clara, CA (US)

( * ) Notice: Subject to any disclaimer, the term of this patent is extended or adjusted under 35 U.S.C. 154(b) by 568 days.

(21) Appl. No.: 12/244,004

(22) Filed: Oct. 2, 2008

(65) Prior Publication Data

US 2009/0026039 A1 Jan. 29, 2009

Related U.S. Application Data

(63) Continuation of application No. 11/838,163, filed on Aug. 13, 2007, now Pat. No. 7,434,676, which is a continuation of application No. 11/067,460, filed on Feb. 25, 2005, now Pat. No. 7,413,069.

(60) Provisional application No. 60/548,574, filed on Feb. 28, 2004.

(51) Int. Cl.
*G06F 7/00* (2006.01)
*B65G 47/10* (2006.01)

(52) U.S. Cl. .................................. 700/230; 198/358

(58) Field of Classification Search ................ 700/230; 198/357, 358, 349, 349.5, 349.6, 349.7
See application file for complete search history.

(56) References Cited

U.S. PATENT DOCUMENTS

| | | | |
|---|---|---|---|
| 3,845,286 A | 10/1974 | Aronstein et al. |
| 3,952,388 A | 4/1976 | Hasegawa et al. |
| 4,027,246 A | 5/1977 | Caccoma et al. |
| 4,049,123 A | 9/1977 | Fegley et al. |
| 4,166,527 A | 9/1979 | Beezer |
| 4,852,717 A | 8/1989 | Ross et al. |
| 4,936,734 A | 6/1990 | Osada |
| 4,974,166 A | 11/1990 | Maney et al. |
| 5,183,378 A | 2/1993 | Asano et al. |
| 5,256,204 A | 10/1993 | Wu |
| 5,372,471 A | 12/1994 | Wu |

(Continued)

FOREIGN PATENT DOCUMENTS

DE 19715974 10/1998

(Continued)

OTHER PUBLICATIONS

Shah et al., U.S. Appl. No. 12/369,722, filed Feb. 11, 2009.

(Continued)

*Primary Examiner* — Ramya Prakasam
(74) *Attorney, Agent, or Firm* — Dugan & Dugan PC

(57) ABSTRACT

In one aspect, a method is provided for electronic device manufacturing. The method includes receiving a request to transfer a carrier to or from a first substrate loading station of an electronic device manufacturing facility, and assigning one of a plurality of carrier supports to carry out the transfer based on a spacing on either side of the assigned carrier being greater than an acceptable spacing. Numerous other aspects are provided.

20 Claims, 9 Drawing Sheets

U.S. PATENT DOCUMENTS

| | | | |
|---|---|---|---|
| 5,382,127 | A | 1/1995 | Garric et al. |
| 5,388,945 | A | 2/1995 | Garric et al. |
| 5,390,785 | A | 2/1995 | Garric et al. |
| 5,411,358 | A | 5/1995 | Garric et al. |
| 5,544,350 | A | 8/1996 | Hung et al. |
| 5,562,383 | A | 10/1996 | Iwai et al. |
| 5,570,990 | A | 11/1996 | Bonora et al. |
| 5,612,886 | A | 3/1997 | Weng |
| 5,668,056 | A | 9/1997 | Wu et al. |
| 5,696,689 | A | 12/1997 | Okumura et al. |
| 5,751,581 | A | 5/1998 | Tau et al. |
| 5,811,211 | A | 9/1998 | Tanaka et al. |
| 5,818,716 | A | 10/1998 | Chin et al. |
| 5,825,650 | A | 10/1998 | Wang |
| 5,884,392 | A | 3/1999 | Lafond |
| 5,888,042 | A | 3/1999 | Oda |
| 5,957,648 | A | 9/1999 | Bachrach |
| 5,971,585 | A | 10/1999 | Dangat et al. |
| 5,976,199 | A | 11/1999 | Wu et al. |
| 5,980,183 | A | 11/1999 | Fosnight |
| 6,009,890 | A | 1/2000 | Kaneko et al. |
| 6,026,561 | A | 2/2000 | Lafond |
| 6,039,316 | A | 3/2000 | Jackson et al. |
| 6,048,259 | A | 4/2000 | Asai |
| 6,050,768 | A | 4/2000 | Iwasaki et al. |
| 6,053,688 | A | 4/2000 | Cheng |
| 6,082,948 | A | 7/2000 | Fishkin et al. |
| 6,120,604 | A * | 9/2000 | Hawkins .................. 118/676 |
| 6,128,588 | A | 10/2000 | Chacon |
| 6,134,482 | A | 10/2000 | Iwasaki |
| 6,183,186 | B1 | 2/2001 | Howells et al. |
| 6,196,001 | B1 | 3/2001 | Tannous et al. |
| 6,240,335 | B1 | 5/2001 | Wehrung et al. |
| 6,256,550 | B1 | 7/2001 | Wu et al. |
| 6,351,686 | B1 | 2/2002 | Iwasaki et al. |
| 6,415,260 | B1 | 7/2002 | Yang et al. |
| 6,431,814 | B1 | 8/2002 | Christensen et al. |
| 6,439,822 | B1 | 8/2002 | Kimura et al. |
| 6,445,977 | B1 * | 9/2002 | Hwang et al. .................. 700/228 |
| 6,463,350 | B2 | 10/2002 | Fukuda et al. |
| 6,526,329 | B2 | 2/2003 | Tateyama et al. |
| 6,540,466 | B2 | 4/2003 | Bachrach |
| 6,579,052 | B1 | 6/2003 | Bonora et al. |
| 6,587,744 | B1 | 7/2003 | Stoddard et al. |
| 6,641,350 | B2 | 11/2003 | Nakashima et al. |
| 6,662,076 | B1 | 12/2003 | Conboy et al. |
| 6,673,638 | B1 | 1/2004 | Bendik et al. |
| 6,675,066 | B2 | 1/2004 | Moshgbar |
| 6,684,124 | B2 | 1/2004 | Schedel et al. |
| 6,702,099 | B2 | 3/2004 | Otaguro et al. |
| 6,715,602 | B1 | 4/2004 | Gartland |
| 6,745,093 | B1 | 6/2004 | Kawano et al. |
| 6,788,996 | B2 | 9/2004 | Shimizu |
| 6,839,603 | B2 | 1/2005 | Karasawa |
| 6,853,876 | B2 | 2/2005 | Wehrung et al. |
| 6,854,583 | B1 | 2/2005 | Horn |
| 6,873,963 | B1 | 3/2005 | Westbury et al. |
| 6,917,844 | B2 | 7/2005 | Kawano et al. |
| 6,971,500 | B2 | 12/2005 | Horn |
| 7,039,495 | B1 | 5/2006 | Conboy et al. |
| 7,051,870 | B2 | 5/2006 | Schoendienst et al. |
| 7,077,264 | B2 | 7/2006 | Rice et al. |
| 7,156,221 | B2 | 1/2007 | Rice et al. |
| 7,177,716 | B2 | 2/2007 | Duffin et al. |
| 7,234,584 | B2 | 6/2007 | Rice et al. |
| 7,243,003 | B2 | 7/2007 | Rice et al. |
| 7,274,971 | B2 | 9/2007 | Brill et al. |
| 7,413,069 | B2 | 8/2008 | Brill et al. |
| 7,434,676 | B2 | 10/2008 | Brill et al. |
| 2001/0038783 | A1 | 11/2001 | Nakashima et al. |
| 2001/0051837 | A1 | 12/2001 | Tateyama et al. |
| 2002/0071744 | A1 | 6/2002 | Bachrach |
| 2002/0081181 | A1 | 6/2002 | Yokomori et al. |
| 2002/0094588 | A1 | 7/2002 | Fan et al. |
| 2002/0114684 | A1 | 8/2002 | Jeong et al. |
| 2002/0116086 | A1 | 8/2002 | Huber et al. |
| 2002/0144654 | A1 | 10/2002 | Elger et al. |
| 2002/0155705 | A1 | 10/2002 | Shimizu |
| 2002/0182040 | A1 | 12/2002 | Kimura et al. |
| 2003/0108407 | A1 | 6/2003 | Ogata et al. |
| 2003/0113190 | A1 | 6/2003 | Bachrach |
| 2003/0202866 | A1 | 10/2003 | Weng et al. |
| 2004/0049398 | A1 | 3/2004 | Gartland et al. |
| 2004/0062633 | A1 | 4/2004 | Rice et al. |
| 2004/0081538 | A1 | 4/2004 | Rice et al. |
| 2004/0187342 | A1 | 9/2004 | Izuta |
| 2004/0225393 | A1 | 11/2004 | Kawano et al. |
| 2004/0262132 | A1 | 12/2004 | Pauley et al. |
| 2005/0209721 | A1 | 9/2005 | Teferra et al. |

FOREIGN PATENT DOCUMENTS

| | | |
|---|---|---|
| EP | 0 365 589 | 9/1992 |
| EP | 0 663 686 | 7/1995 |
| EP | 0 850 720 | 7/1998 |
| EP | 1128246 | 8/2001 |
| JP | 55-091839 | 7/1980 |
| JP | 58-028860 | 2/1983 |
| JP | 60-049623 | 3/1985 |
| JP | 63234511 | 9/1988 |
| JP | 01-181156 | 7/1989 |
| JP | 01-257549 | 10/1989 |
| JP | 02-015647 | 1/1990 |
| JP | 05-128131 | 5/1993 |
| JP | 05-290053 | 11/1993 |
| JP | 6132696 | 5/1994 |
| JP | 06-260545 | 9/1994 |
| JP | 08-249044 | 9/1996 |
| JP | 09-115817 | 5/1997 |
| JP | 10-135096 | 5/1998 |
| JP | 11-176717 | 7/1999 |
| JP | 11-296208 | 10/1999 |
| JP | 2000-012646 | 1/2000 |
| JP | 2001-332464 | 11/2001 |
| JP | 2003-007584 | 1/2003 |
| JP | 2003-124286 | 4/2003 |
| WO | WO 99/28952 | 6/1999 |
| WO | WO 2005/006408 | 1/2005 |

OTHER PUBLICATIONS

Przelocki, H. et al., "Diastemos-computerized system of IC manufacturing control and diagnostics", 1990, Elektronika, vol. 31 No. 11-12, pp. 38-40, Polish Language. (Abstract only).

Lovell, A.M. et al., "Cell automation: integrating manufacturing with robotics", Dec. 1990, Solid State Technology, vol. 33 No. 12, p. 37-9.

Prasad, K., "A generic computer simulation model to characterize photolithography manufacturing area in an IC FAB facility", Sep. 1991, IEEE Transactions on Components, Hybrids, and Manufacturing Technology, vol. 14 No. 3, p. 483-7.

Ehteshami, B. et al., "Trade-offs in cycle time management: hot lots", May 1992, IEEE Transactions on Semiconductor Manufacturing, vol. 5 No. 2, p. 101-6.

Lou, S. et al., "Using simulation to test the robustness of various existing production control policies", 1991, 1991 Winter Simulation Conference Proceedings, IEEE, p. 261-9.

Berg, R. et al., "The formula: world class manufacturing for hybrid thin-film component production", 1992, IEEE/SEMI International Semiconductor Manufacturing Science Symposium, pp. 53-60.

Naguib, H., "The implementation of total quality management in a semiconductor manufacturing operation", 1992, IEEE/SEMI International Semiconductor Manufacturing Science Symposium, p. 63-7.

Rose, D., "Productivity enhancement", 1992, IEEE/SEMI International Semiconductor Manufacturing Science Symposium, p. 68.

Narayanan, S. et al., "Object-oriented simulation to support operator decision making in semiconductor manufacturing", 1992, 1992 IEEE International Conference on Systems, Man and Cybernetics, vol. 2, p. 1510-15.

Leonvich, G. A. et al., "Integrated cost and productivity learning in CMOS semiconductor manufacturing", Jan.-Mar. 1995, IBM Journal of Research and Development, vol. 39 No. 1-2, p. 201-13.

Leonvich, G., "An approach for optimizing WIP/cycle time/output in a semiconductor fabricator", 1994, Sixteenth IEEE/CPMT International Electronics Manufacturing Technology Symposium, 'Low- Cost Manufacturing Technologies for Tomorrow's Global Economy', Proceedings 1994 IEMT Symposium, vol. 1, p. 108-11.

Schomig, A.K. et al., "Performance modelling of pull manufacturing systems with batch server", 1995, Proceedings 1995 INRIA/IEEE Symposium on Emerging Technologies and Factory Automation, ETFA '95, vol. 3, p. 175-83.

Juba, R.C. et al., "Production improvements using a forward scheduler", 1996, Seventeenth IEEE/CPMT International Electronics Manufacturing Technology Symposium 'Manufacturing Technologies—Present and Future', p. 205-9.

Fuller, L.F. et al., "Improving manufacturing performance at the Rochester Institute of Technology integrated circuit factory", 1995, IEEE.SEMI 1995 Advanced Semiconductor Manufacturing Conference and Workshop, Theme—Semiconductor Manufacturing: Economic Solutions for the 21st Century, ASMC '95 Proceedings, p. 350-5.

Yan, Houmin et al., "Testing the robustness of two-boundary control policies in semiconductor manufacturing", May 1996, IEEE Transactions on Semiconductor Manufacturing, vol. 9 No. 2, p. 285-8.

Lopez, M.J. et al., "Performance models of systems of multiple cluster tools", 1996 Nineteenth IEEE/CPMT International Electronics Manufacturing Technology Symposium. Proceedings 1996 IEMT Symposium, pp. 57-65.

Collins, D. W. et al., "Implementation of Minimum Inventory Variability Scheduling 1-Step Ahead Policy.RTM. in a large semiconductor manufacturing facility", 1997, 1997 IEEE 6th International Conference on Emerging Technologies and Factory Automation Proceedings, pp. 497-504.

Labanowski, L., "Improving overall fabricator performance using the continuous improvement methodology", 1997, 1997 IEEE/SEMI advanced Semiconductor Manufacturing Conference and Workshop. Theme—The Quest for Semiconductor Manufacturing Excellence: Leading the CHange into the 21st Century. ASMC Proceedings, pp. 405-409.

Dudde, R. et al., "Flexible data registration and automation in semiconductor production", 1997, Proceedings of the SPIE—The International Society for Optical Engineering, pp. 171-181.

Padillo, J. M. et al., "A stratgeic domain:IE in the semiconductor industry", Mar. 1998, IIE Solutions, pp. 36-40, 42.

Collins, D. W. et al., "Investigation of minimum inventory variability scheduling policies in a large semiconductor manufacturing facility", 1997, Proceedings of the 1997 American Control Conference, vol. 3, pp. 1924-1928.

Rose, O., "WIP evolution of a semiconductor factory after a bottleneck workcenter breakdown", 1998, 1998 Winter Simulation Conference. Proceedings, vol. 2, pp. 997-1003.

Iriuchijima, K. et al., "WIP allocation planning for semiconductor factories", 1998, proceedings of the 37th IEEE Conference on Decision and Control, vol. 3, pp. 2716-2721.

Weiss, M., "New twists on 300 mm fab design and layout", Jul. 1999, Semiconductor International, vol. 22 No. 8, pp. 103-104, 106, 108.

Van Antwerp, K. et al., "Improving work-in-progress visibility with active product tags", Oct. 1999, Micro, vol. 17 No. 9, pp. 67-69, 72-73.

Martin, D. P., "Total operational efficiency (TOE): the determination of 2 capacity and cycle time components and their relationship to productivity improvements in a semiconductor manufacturing line", 1999, 10th Annual IEEE/SEMI. Advanced Semiconductor Manufacturing Conference and Workshop. ASMC 99 Proceedings, pp. 37-41.

Martin, D. P., "Capacity and cycle time-throughput understanding system (CAC-TUS) an analysis tool to determine the components of capacity and cycle time in a semiconductor manufacturing line", 1999, 10th Annual IEEE/SEMI. Advanced Semiconductor Manufacturing Conference and Workshop. SMC 99 Proceedings, pp. 127-131.

Marcoux, P. et al., "Determining capacity loss from operational and technical deployment practices in a semiconductor manufacturing line", 1999, 1999 IEEE International Symposium on Semiconductor Manufacturing Conference Proceedings, pp. 3-5.

Chen, J. C. et al., "Capacity planning for the twin fab", 1999, 1999 IEEE International Symposium on Semiconductor Manufacturing Conference Proceedings, pp. 317-320.

Wei Jun-Hu et al., "Optimization methodology in simulation-based scheduling for semiconductor manufacturing", Oct. 2000, Information and Control, vol. 29 No. 5, pp. 425-430, Chinses Language. (Abstract only).

Hughlett, E., "Incremental levels of automation in the compound semiconductor fab", Aug. 2001, Compound Semiconductor, vol. 7 No. 7, pp. 69-73.

Sarin, S. C. et al., "Reduction of average cycle time at a wafer fabrication facility", 2001, 2001 GaAs MANTECH Conference. Digest of Papers, pp. 241-246.

Saito, K. et al., "A simulation study on periodical priority dispatching of WIP for product-mix fabrication", 2002, 13th Annual IEEE/SEMI Advanced Semiconductor Manufacturing Conference. Advanceing the Science and Technology of Semiconductor manufacturing. ASMC 2002, pp. 33-37.

Wang, J. et al., "The improvement of automated material handling system traffic control", 2002, 2002 Semiconductor Manufacturing Technology Workshop, pp. 271-274.

Lee, Wei Jie, "Optimize WIP scale through simulation approach with WIP, turn-over rate and cycle time regression analysis in semiconductor fabrication", 2002, 2002 Semiconductor Manufacturing Technology Workshop, pp. 299-301.

Lee, Young Hoon et al., "Push-pull production planning of the re-entrant process", 2003, International Journal of Advanced Manufacturing Technology, vol. 22 No. 11-12, pp. 922-931.

Garlid, Scott C., "From philosophy to reality: interpreting the rules of JIT for IC manufacturing", 1989, SME Technical Paper (Series) MS. Publ by SME, pp. MS89-797-1-15.

Anon, "Wafer level automation", Jan. 1995, European Semiconductor, vol. 17 No. 1, pp. 17 and 19.

Anon, "The coming of fab-wide automation", May 1998, European Semiconductor Design Production Assembly, vol. 20 No. 5, pp. 21-22.

Pierce, Neal G. et al., "Dynamic dispatch and graphical monitoring system", 1999, IEEE International Symposium on Semiconductor Manufacturing Conference, Proceedings 1999, pp. 65-68.

Nagesh, Sukhi et al., "Intelligent seond-generation MES solutions for 300mm fabs", 2000, Solid State Technology, vol. 43 No. 6, pp. 133-134,136, 138.

"300mm single-wafer transport", Jul. 1999, Solid State Technology—semiconductor manufacturing and wafer fabrication, Semicon West '99 Product Spotlight, pp. 5-6.

"300mm single-wafer handling", Apr. 2000, Solid State Technology, Product News, <www.sold-state.com>, p. 99.

Griessing, Jurgen et al., "Assessing the feasibility of a 33-mm test and monitor wafer handeling and logistics system", Jul. 2000, Micro: The 300-mm Imperative, pp. 1-19.

"The Leading Company in Micro environment", Jan. 3, 2002, Incam Solutions Company, pp. 1-2.

"Improved wafer isolation and additional flexibility", Jan. 3, 2002, Incam Solutions Company SWIF technology, pp. 1-2.

"SEMI standard compliance" and "Related SEMI standards", Jan. 3, 2002, Incam Solutions Related standards, p. 1.

"Single Wafer lots Solution", Jan. 3, 2002, Incam Solutions References, p. 1.

European Search Report of European Application No. 05004335 dated Feb. 7, 2006.

Office Action of Taiwan Patent Application No. 094105944 dated Mar. 19, 2007.

Office Action of U.S. Appl. No. 11/067,460 mailed Oct. 24, 2006.

Feb. 27, 2007 Response to Office Action of U.S. Appl. No. 11/067,460 mailed Oct. 24, 2006.

Notice of Allowance of U.S. Appl. No. 11/067,460 mailed Mar. 16, 2007.

Office Action of U.S. Appl. No. 11/067,460 mailed Sep. 14, 2007.

Mar. 14, 2008 Response to Office Action of U.S. Appl. No. 11/067,460 mailed Sep. 14, 2007.

Notice of Allowance of U.S. Appl. No. 11/067,460 mailed Apr. 16, 2008.

Office Action of U.S. Appl. No. 11/838,163 mailed Jan. 7, 2008.

May 7, 2008 Response to Office Action of U.S. Appl. No. 11/838,163 mailed Jan. 7, 2008.

Notice of Allowance of U.S. Appl. No. 11/838,163 mailed Aug. 7, 2008.

* cited by examiner

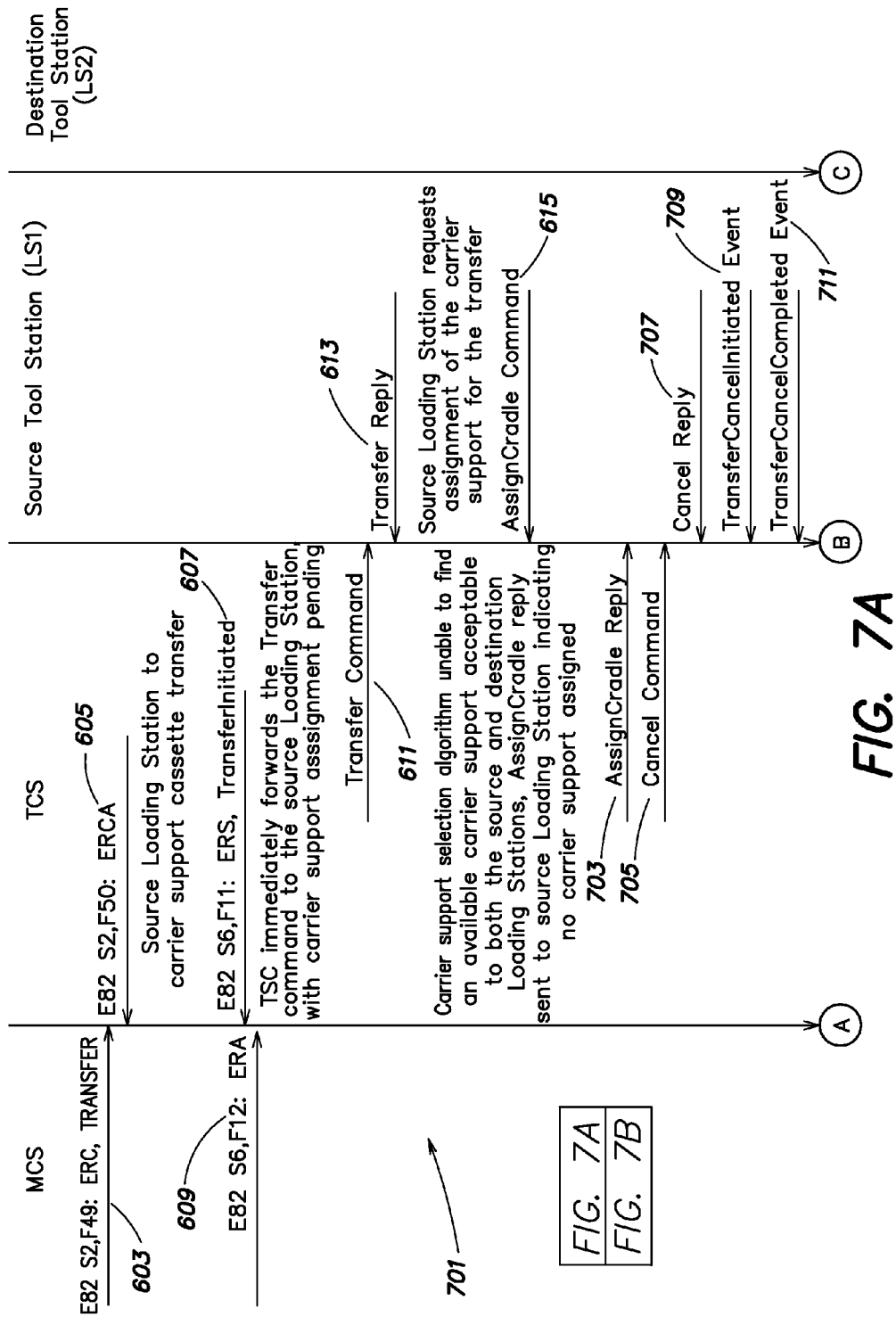

METHODS AND APPARATUS FOR TRANSFERRING A SUBSTRATE CARRIER WITHIN AN ELECTRONIC DEVICE MANUFACTURING FACILITY

The present application is a continuation of and claims priority to U.S. application Ser. No. 11/838,163, filed Aug. 13, 2007 now U.S. Pat. No. 7,434,676, which is a continuation of U.S. application Ser. No. 11/067,460, filed Feb. 25, 2005, now U.S. Pat. No. 7,413,069, which claims priority to U.S. Provisional Patent Application Ser. No. 60/548,574, filed Feb. 28, 2004. The content of the above-identified patent applications are hereby incorporated by reference herein in their entirety for all purposes.

CROSS REFERENCE TO RELATED APPLICATIONS

The present application is also related to the following commonly-assigned, co-pending U.S. patent applications, each of which is hereby incorporated by reference herein in its entirety for all purposes:

U.S. patent application Ser. No. 11/067,302, filed Feb. 25, 2005 and titled "METHODS AND APPARATUS FOR ENHANCED OPERATION OF SUBSTRATE CARRIER HANDLERS";

U.S. patent application Ser. No. 11/067,311, filed Feb. 25, 2005 and titled "METHODS AND APPARATUS FOR MATERIAL CONTROL SYSTEM INTERFACE";

U.S. patent application Ser. No. 11/067,303, filed Feb. 25, 2005 and titled "METHODS AND APPARATUS FOR ELECTRONIC DEVICE MANUFACTURING SYSTEM MONITORING AND CONTROL";

U.S. patent application Ser. No. 10/650,310, filed Aug. 28, 2003 and titled "SYSTEM FOR TRANSPORTING SUBSTRATE CARRIERS";

U.S. patent application Ser. No. 10/764,982, filed Jan. 26, 2004 and titled "METHODS AND APPARATUS FOR TRANSPORTING SUBSTRATE CARRIERS";

U.S. patent application Ser. No. 10/650,480, filed Aug. 28, 2003 and titled "SUBSTRATE CARRIER HANDLER THAT UNLOADS SUBSTRATE CARRIERS DIRECTLY FROM A MOVING CONVEYOR"; and U.S. patent application Ser. No. 10/987,955, filed Nov. 12, 2004 and titled "BREAK-AWAY POSITIONING CONVEYOR MOUNT FOR ACCOMMODATING CONVEYOR BELT BENDS".

FIELD OF THE INVENTION

The present invention relates generally to electronic device manufacturing, and is more particularly concerned with methods and apparatus for transferring a substrate carrier within an electronic device manufacturing facility.

BACKGROUND

An electronic device manufacturing facility may include conventional systems for transferring substrate carriers about the facility during manufacturing. However, such conventional systems may inefficiently transfer the carriers. Accordingly, improved methods and apparatus for transferring a substrate carrier within an electronic device manufacturing facility are desired.

SUMMARY OF THE INVENTION

In a first aspect of the invention, a method of electronic device manufacturing is provided. The method includes receiving a request to transfer a carrier to or from a first substrate loading station of an electronic device manufacturing facility including a plurality of substrate loading stations, wherein the facility further includes a plurality of carrier supports coupled to a conveyor system adapted to move carriers within the facility; and assigning one of the plurality of carrier supports to carry out the transfer based on a spacing on either side of the assigned carrier of the plurality of carrier supports being greater than an acceptable spacing.

In another aspect of the invention, a method of electronic device manufacturing is provided including selecting a carrier support to transfer a carrier to or from a substrate loading station of an electronic device manufacturing facility including a plurality of carrier supports coupled to a conveyor system and adapted to move carriers within the facility, wherein the step of selecting the carrier support to carry out the transfer is based on an acceptable spacing between adjacent carrier supports.

In yet another aspect of the invention, a method of electronic device manufacturing is provided including assigning a carrier support to transfer a carrier from a first substrate loading station to a second substrate loading station of an electronic device manufacturing facility including a plurality of carrier supports coupled to a conveyor system and adapted to move carriers within the facility; determining whether a spacing on either side of the assigned carrier support of the plurality of carrier supports is greater than an acceptable spacing; and if so transferring the carrier on the assigned carrier.

In another aspect of the invention, an apparatus for electronic device manufacturing is provided including a control system of an electronic device manufacturing facility adapted to: issue a request to transfer a carrier to or from a substrate loading station, wherein the facility further includes a plurality of carrier supports coupled to a conveyor system adapted to move carriers within the facility; assign one of the plurality of carrier supports to carry out the transfer of the carrier; and verify whether a spacing on either side of the assigned carrier support of the plurality of carrier supports is greater than an acceptable spacing.

Numerous other aspects are provided in accordance with these and other aspects of the invention. Other features and aspects of the present invention will become more fully apparent from the following detailed description, the appended claims and the accompanying drawings.

BRIEF DESCRIPTION OF THE FIGURES

FIGS. 7A and 7B illustrate handshaking while initiating a substrate carrier transfer within the facility in which a carrier support is unsuccessfully assigned in accordance with an embodiment of the present invention.

DETAILED DESCRIPTION

Figure 1A:
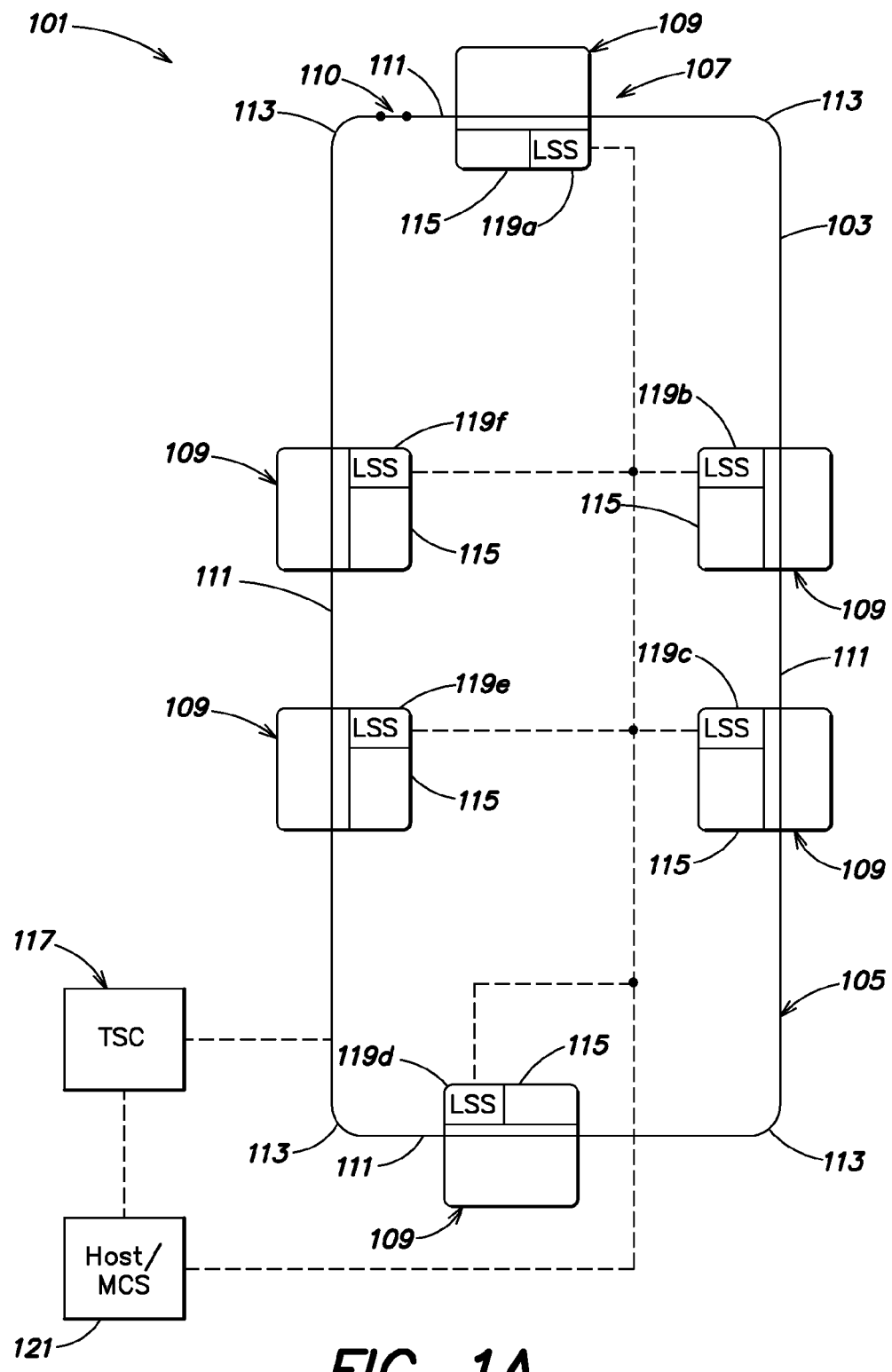
FIG. 1A is a schematic top view of an exemplary conveyor system comprising a band (or ribbon) that forms a simple loop within a portion of an electronic device manufacturing facility in accordance with an embodiment of the present invention.

An electronic device manufacturing facility may use an overhead transport system (OHT system) that includes a plurality of carrier supports coupled to a moving conveyor system adapted to transfer one or more substrate carriers within the electronic device manufacturing facility. Further, such a facility may include tools adapted to process an electronic device during electronic device manufacturing. Each processing tool may be coupled to a respective substrate loading station adapted to transfer a carrier between the processing tool and the moving conveyor system. More specifically, each processing tool may be coupled to a respective substrate loading station adapted to transfer a carrier between the processing tool and a carrier support coupled to the moving OHT system. In this manner, a carrier may be transferred within the facility.

The present invention provides methods and apparatus for assigning a carrier support for transferring a carrier within the facility. The features of the present invention are particularly advantageous with the use of single or small lot size substrate carriers. As used herein, the term "small lot size" substrate carrier or "small lot" carrier may refer to a carrier that is adapted to hold fewer substrates than a conventional "large lot size" carrier which typically holds thirteen or twenty-five substrates. As an example, a small lot size carrier may be adapted to hold five or less substrates. In some embodiments, other small lot size carriers may be employed (e.g., small lot size carriers that hold one, two, three, four or more than five substrates, but less than that of a large lot size carrier). In general, each small lot size carrier may hold too few substrates for human transport of carriers to be viable within an electronic device or other manufacturing facility.

An algorithm may be employed for assigning the carrier support such that at least one of a time required for the transfer is reduced and balance of the conveyor system is maintained. In this manner, the carrier may be transferred within the facility more efficiently than in conventional electronic device manufacturing systems, thereby improving electronic device manufacturing throughput compared to such conventional systems. For example, the algorithm may select one of the plurality of carrier supports to transfer or deliver a carrier from a first substrate loading station (e.g., a source substrate loading station) to a second substrate loading station (e.g., a destination substrate loading station). The algorithm may determine whether employing the selected carrier support will conflict with a pending transfer (e.g., within the facility). If so, the algorithm may select another carrier support from the plurality of carrier supports and make a similar determination for such carrier support. If the algorithm determines that employing the selected carrier support will not conflict with a pending transfer, the selected carrier support may be assigned for transferring the carrier from the first substrate loading station to the second substrate loading station.

In this manner, the present methods and apparatus may assign a carrier support for transferring a carrier within the facility such that, when the assigned carrier support arrives at the first substrate loading station, the first substrate loading station is prepared to place the carrier onto the moving conveyor system using the assigned carrier support, and when the assigned carrier support arrives at the second substrate loading station, the second substrate loading station is prepared to remove the carrier from the moving conveyor (e.g., from the assigned carrier support coupled thereto). In this manner, the number of times the assigned carrier support on the moving conveyor must be transferred to the first substrate loading station before the first substrate loading station is prepared to place a carrier on the carrier support and/or the number of times the assigned carrier support (along with the carrier coupled thereto) must be transferred to the second substrate loading station before the second substrate loading station is prepared to remove the carrier from the carrier support may be reduced.

The algorithm may determine whether employing the selected carrier support will unbalance the conveyor system, and may assign a carrier support based thereon. In this manner, the algorithm may assign a carrier support for transferring a carrier within the facility such that the moving conveyor system remains balanced (e.g., is not overloaded at any particular portions by carrier supports supporting carriers thereon) thereby reducing excessive stress on portions of the moving conveyor system, which may adversely affect electronic device manufacturing. Consequently, the present methods and apparatus may transfer a carrier more efficiently than in conventional electronic device manufacturing systems, thereby improving manufacturing throughput compared to conventional systems.

Previously incorporated U.S. patent application Ser. No. 10/650,310, filed Aug. 28, 2003 and titled "System For Transporting Substrate Carriers", discloses a substrate carrier transport system or similar delivery system that includes a conveyor for substrate carriers that is intended to be constantly in motion during operation of the fabrication facility which it serves. The constantly moving conveyor is intended to facilitate transportation of substrates within the fabrication facility so as to reduce the total "dwell" time of each substrate in the fabrication facility.

To operate a fabrication facility in this manner, methods and apparatus should be provided for unloading substrate carriers from the conveyor, and for loading substrate carriers onto the conveyor, while the conveyor is in motion. Previously incorporated U.S. patent application Ser. No. 10/650, 480, filed Aug. 28, 2003 and titled "Substrate Carrier Handler That Unloads Substrate Carriers Directly From a Moving Conveyor", discloses a substrate carrier handler at a substrate loading station or "substrate loading station" that may perform such loading/unloading operations with respect to a moving conveyor. For example, a substrate loading station or substrate loading station may include a horizontal guide or crane that is moveable vertically, and an end effector that is moveable horizontally along the horizontal guide. Other configurations for moving the end effector vertically and/or horizontally are provided.

To unload a substrate carrier from a moving conveyor that transfers substrate carriers (a "substrate carrier conveyor") and that passes by the substrate loading station, the end effector is moved horizontally at a velocity that substantially matches the velocity of the substrate carrier as it is being transported by the substrate carrier conveyor (e.g., by substantially matching substrate carrier speed in a horizontal direction). In addition, the end effector may be maintained in a position adjacent the substrate carrier as the substrate carrier is being transported. The end effector thus may substantially match a position of the substrate carrier while substantially matching a velocity of the substrate carrier. Likewise, conveyor position and/or velocity may be substantially matched.

While the end effector substantially matches the substrate carrier's velocity (and/or position), the end effector is raised so that the end effector contacts the substrate carrier and disengages the substrate carrier from the substrate carrier conveyor. A substrate carrier similarly may be loaded onto the moving substrate carrier conveyor by substantially matching end effector and conveyor velocities (and/or positions) during loading. In at least one embodiment, such substrate carrier handoffs between the end effector and substrate carrier conveyor are performed at a substantially zero velocity and/or acceleration between the end effector and the substrate carrier.

Previously incorporated U.S. patent application Ser. No. 10/764,982, filed Jan. 26, 2004 and titled "Methods and Apparatus for Transporting Substrate Carriers", describes a conveyor system that may be employed with the above-described substrate carrier transport system and/or substrate loading station for transporting substrate carriers between one or more processing tools of a semiconductor device manufacturing facility. The conveyor system may include a ribbon (or "band") that forms a closed loop within at least a portion of the semiconductor device manufacturing facility and that transports substrate carriers therein. In one or more embodiments, the ribbon or band may be formed from stainless steel, polycarbonate, composite materials (e.g., carbon graphite, fiberglass, etc.), steel or otherwise reinforced polyurethane, epoxy laminates, plastic or polymer materials that include stainless steel, fabric (e.g., carbon fiber, fiberglass, Kevlar® available from DuPont, polyethylene, steel mesh, etc.) or another stiffening material, etc. By orienting the ribbon so that a thick portion of the ribbon resides within a vertical plane and a thin portion of the ribbon resides within a horizontal plane, the ribbon is flexible in the horizontal plane and rigid in the vertical plane. Such a configuration allows the conveyor to be constructed and implemented inexpensively. For example, the ribbon requires little material to construct, is easy to fabricate and, due to its vertical rigidity/strength, can support the weight of numerous substrate carriers without supplemental support structure (such as rollers or other similar mechanisms used in conventional, horizontally-oriented belt-type conveyor systems). Furthermore, the conveyor system is highly customizable because the ribbon may be bent, bowed or otherwise shaped into numerous configurations due to its lateral flexibility.

FIG. 1A is a schematic top view of an exemplary conveyor system 101 comprising a band (or ribbon) 103 that forms a simple loop 105 within a portion of an electronic device (e.g., semiconductor device) manufacturing facility 107 in accordance with an embodiment of the present invention. The band 103 may comprise, for example, one of the ribbons described in U.S. patent application Ser. No. 10/764,982, filed Jan. 26, 2004 and titled "Methods and Apparatus for Transporting Substrate Carriers". The band 103 transports substrate carriers (not shown in FIG. 1A) between processing tools 109 via respective carrier supports 110 coupled to the band 103, and comprises straight portions 111 and curved portions 113 to form the (closed) loop 105. Other number of processing tools 109 and/or loop configurations may be employed.

Each processing tool 109 may include a substrate carrier handler at a substrate loading station 115 (e.g., a "tool station") of the processing tool 109, for unloading a substrate carrier from, or for loading a substrate carrier onto, the moving band 103 of the conveyor system 101 as the band 103 passes by the substrate loading station 115 (as described in U.S. patent application Ser. No. 10/650,480, filed Aug. 28, 2003 and titled "Substrate Carrier Handler That Unloads Substrate Carriers Directly From a Moving Conveyor"). For example, an end effector (not separately shown) of a substrate loading station 115 may be moved horizontally at a velocity that substantially matches the velocity of the substrate carrier as it is being transported by the band 103, maintained in a position adjacent the substrate carrier as the substrate carrier is being transported and raised so that the end effector contacts the substrate carrier and disengages the substrate carrier from the conveyor system 101. A substrate carrier similarly may be loaded onto the moving band 103 by substantially matching end effector and band velocities (and/or positions) during loading.

Each substrate loading station 115 may include one or more load ports or similar locations where substrates or substrate carriers are placed for transfer to and/or from a processing tool 109 (e.g., one or more docking stations, although transfer locations that do not employ docking/undocking movement may be employed). Various substrate carrier storage locations also may be provided at each substrate loading station 115 for substrate carrier buffering at a processing tool 109.

The conveyor system 101 includes a transport system controller (TSC) 117 for controlling operation of the band 103. For example, the TSC 117 may control/monitor the speed or velocity and/or status of the band 103, allocate carrier supports 110 of the band that are used to support/transport substrate carriers, monitor status of the carrier supports 110, monitor status of band motors/drives, provide such information to each substrate loading station 115 or the like. Additionally or alternatively, as described in detail below, the TSC 117 may employ an algorithm to assign or allocate carrier supports 110 for transporting carriers. Likewise, each substrate loading station 115 may include substrate loading station software (LSS) 119 for controlling substrate loading station operation (e.g., loading or unloading of substrate carriers to/from the conveyor system 101, transporting of substrate carriers to/from load ports or storage locations of the substrate loading station 115 and/or processing tool 109 serviced by the substrate loading station 115, etc.). For example, the LSS 119a-f may operate with a substrate loading station controller (e.g., an intercept controller, not shown). A host/material control system (MCS) 121 communicates with the transport system controller 117 and the substrate loading station software 119a-f of each substrate loading station 115 for affecting operation of the same. In this manner, the TSC 117 may be adapted to interface with the MCS 121, substrate loading stations and/or transfer stations of the facility to perform intra-bay and/or inter-bay carrier transfers. The TSC 117, each LSS 119a-f and/or the MCS 121 may include a scheduler (not shown) for controlling scheduling of the operations performed by the TSC 117, LSS 119a-f and/or the MCS 121.

The above system is especially well suited for transferring small lot size substrate carriers, such as substrate carriers that hold a single substrate or substantially fewer than 25 substrates.

Figure 1B:
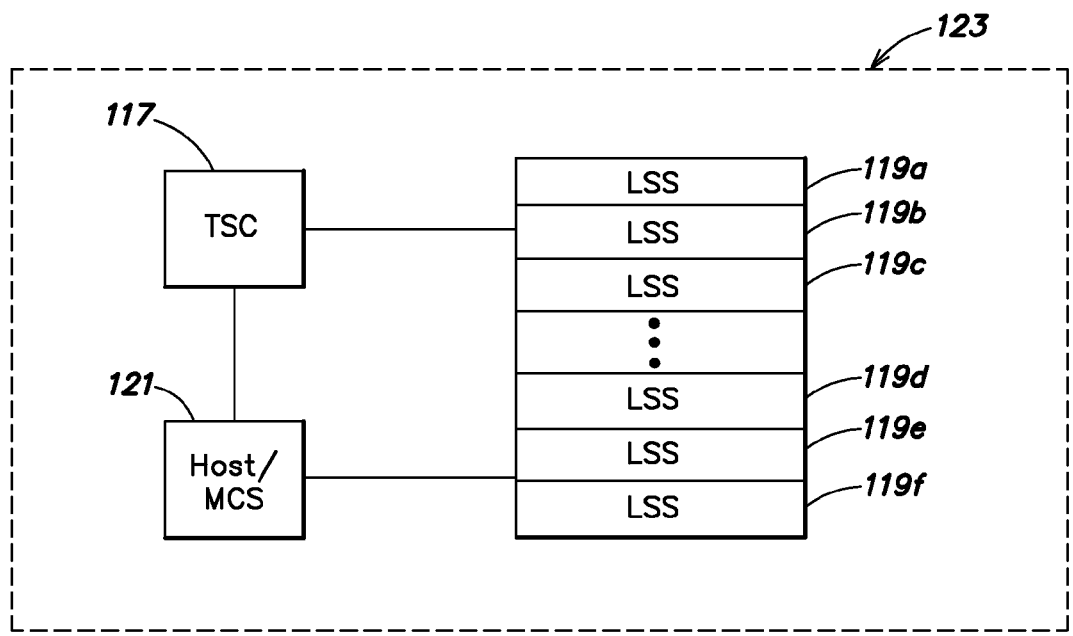
FIG. 1B is a block diagram of a control system included in the exemplary continuously moving conveyor system in accordance with an embodiment of the present invention.

FIG. 1B is a block diagram of a control system included in the exemplary continuously moving conveyor system in accordance with an embodiment of the present invention. With reference to FIG. 1B, the LSS 119a-f corresponding to each processing tool 109, the TSC 117 and MCS 121 may form a control system 123 adapted to control operation of the continuously moving conveyor system 101. Details of how the control system 123 operates, and more specifically, how the control system 123 may cause the conveyor system 101 to transfer a substrate carrier within the facility in accordance with an embodiment of the present invention are described below with reference to FIGS. 2-7.

Figure 2:
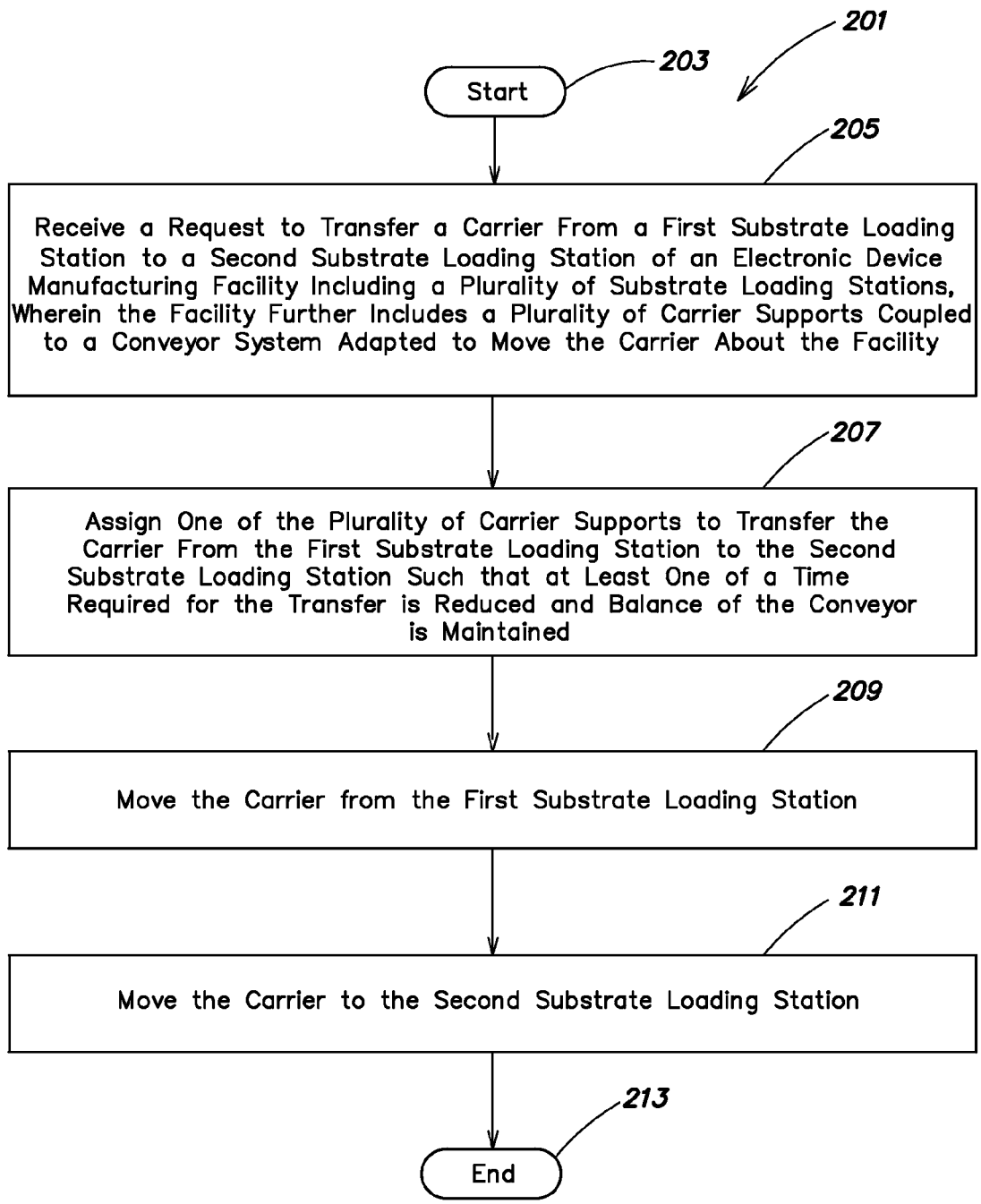
FIG. 2 illustrates a method for transferring a substrate carrier within the facility in accordance with an embodiment of the present invention.

FIG. 2 illustrates a method for transferring a substrate carrier within the facility in accordance with an embodiment of the present invention. With reference to FIG. 2, in step 203, the method 201 begins. In step 205, a request to transfer a carrier from a first substrate loading station to a second substrate loading station of an electronic device manufacturing facility including a plurality of substrate loading stations may be received, wherein the facility further includes a plurality of carrier supports 110 coupled to a conveyor system adapted to move the carrier within the facility. More specifically, the MCS 121 may issue a request to transfer a specified substrate carrier between the first and second substrate loading stations. The TSC 117 may receive the request from the MCS 121. In response to receiving the request, the TSC 117 may communicate with the first and/or second substrate loading stations. Details of exemplary communication between the TSC 117 and the first and/or second substrate loading stations are described below with reference to FIGS. 6 and 7.

In step 207, one of the plurality of carrier supports 110 may be assigned to transfer the carrier from the first substrate loading station to the second substrate loading station such that at least one of a time required for the transfer is reduced and balance of the conveyor system is maintained. For example, the TSC 117 may assign one of the plurality of carrier supports 110 to transfer the carrier from the first substrate loading station to the second substrate loading station such that a time required for the transfer is reduced and/or balance of the conveyor system is maintained. In other words, if the control system 123, or any part thereof, determines that either (1) the assignment conflicts with a pending transfer; or (2) the assignment will result in an unacceptable distribution of carriers (e.g., a high density of carriers in a single portion of the band 103 as compared to another portion), the TSC 117 may assign a different carrier support 110 (e.g., one that avoids the conflict or imbalance) to transfer the carrier. By reducing the time required for the transfer in this manner, the operating efficiency of the facility and/or the conveyor system 101 included therein may be increased. Additionally or alternatively, reducing the time required for the transfer in this manner may increase the manufacturing throughput of the facility.

By maintaining the balance of the conveyor system, the control system 123 may reduce overloading of one or more portions of the moving conveyor system 101, such as one or more portions of the band 103. Requiring the moving conveyor system 101 to support an unbalanced load (or an unacceptable density of carriers) may place excessive stress on the band 103. The control system 123 may assign carrier supports 110 such that excessive stress on the band 103 is avoided. By reducing excessive stress on one or more portions of the moving conveyor system 101, the reliability of the conveyor system 101 increases, thereby reducing conveyor system 101 down time. Consequently, the control system 123 may cause a carrier to be transferred more efficiently, thereby improving manufacturing throughput compared to conventional systems.

In some embodiments, the TSC 117 may employ an algorithm to assign one of the plurality of carrier supports to transfer the carrier from the first substrate loading station to the second substrate loading station such that at least one of a time required for the transfer is reduced and balance of the conveyor system is maintained. Details of exemplary methods for assigning one of the plurality of carrier supports to transfer the carrier from the first substrate loading station to the second substrate loading station such that a time required for the transfer is reduced and/or balance of the conveyor system is maintained are described below with reference to FIGS. 3 and 4, which illustrate first and second exemplary methods, respectively, for assigning a carrier support when transferring a substrate carrier within the facility in accordance with an embodiment of the present invention.

In step 209, the carrier may be moved from the first substrate loading station. More specifically, the control system 123 may cause the carrier to be removed from the first substrate loading station and placed onto the assigned carrier support. Once the carrier is placed on the assigned carrier support, the moving conveyor system 101 may transfer the carrier from the first substrate loading station.

In step 211, the carrier may be moved to the second substrate loading station. More specifically, the control system 123 may cause the conveyor system 101 to move the carrier toward the second substrate loading station. The control system 123 may cause the carrier to be removed from the carrier support when the carrier support arrives at the second substrate loading station and transferred to the second substrate loading station.

Thereafter, step 213 is performed. In step 213, the method 201 ends. Through the use of the method 201 of FIG. 2, a carrier may be transferred more efficiently and manufacturing throughput may be improved.

Figure 3:
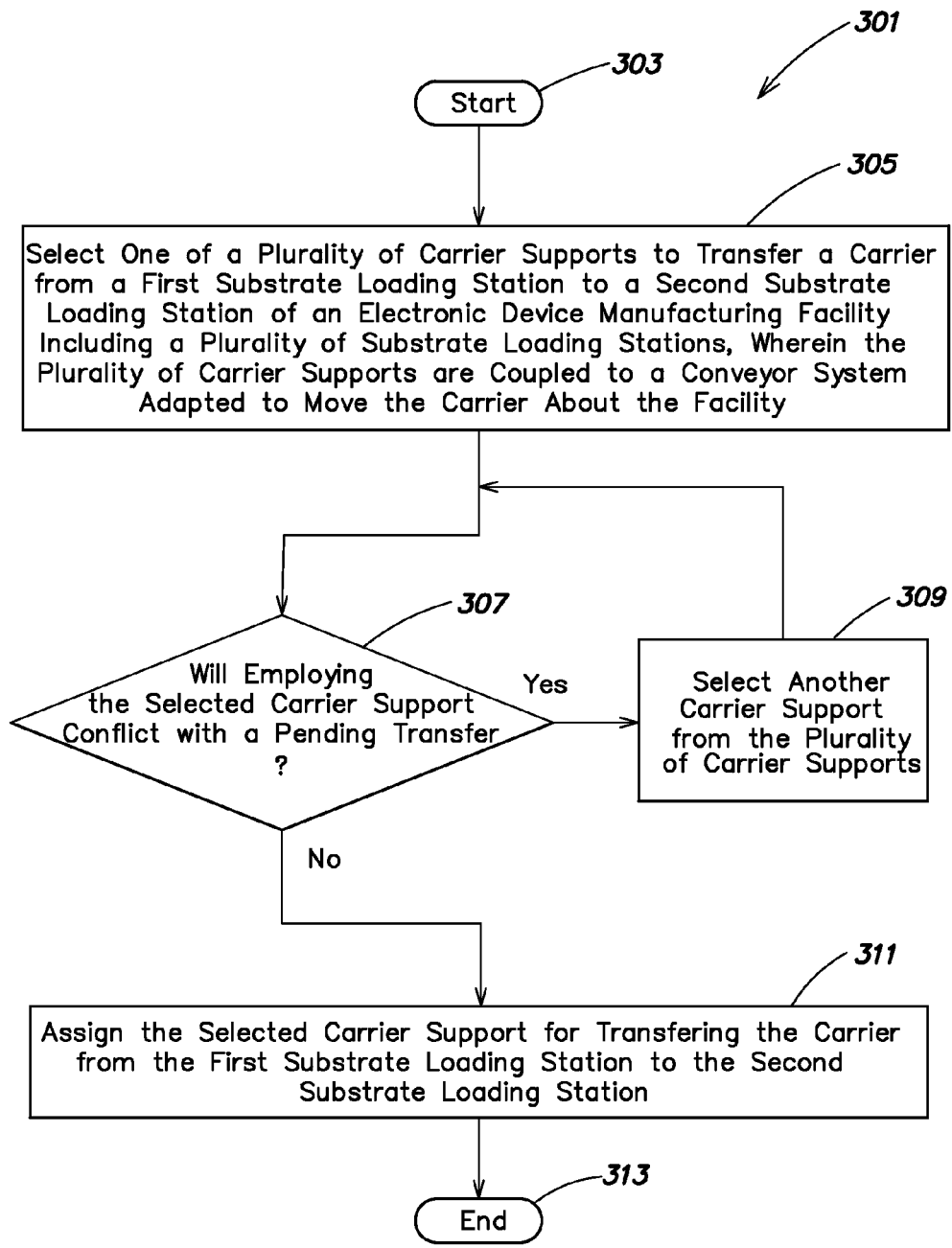
FIG. 3 illustrates a first exemplary method for assigning a carrier support when transferring a substrate carrier within the facility in accordance with an embodiment of the present invention.

FIG. 3 illustrates a first exemplary method for assigning a carrier support when transferring a substrate carrier within the facility in accordance with an embodiment of the present invention. With reference to FIG. 3, in step 303, the method 301 begins. In step 305, one of a plurality of carrier supports may be selected to transfer a carrier from a first substrate loading station to a second substrate loading station of an electronic device manufacturing facility including a plurality of substrate loading stations, wherein the plurality of carrier supports are coupled to a conveyor system adapted to move carriers about the facility. For example, the control system 123 may select one of the plurality of carrier supports based on a previous transfer at the first substrate loading station. More specifically, the control system 123 may select one of the plurality of carrier supports based on a carrier support employed for the preceding transfer at the substrate loading station. However, the control system 123 may select one of the plurality of carrier supports based on additional and/or different factors.

In step 307, it is determined whether employing the selected carrier support will conflict with a pending transfer. More specifically, the control system 123 may determine whether employing the selected carrier support to transfer the carrier between the first substrate loading station and the second substrate loading station will conflict with any pending carrier transfer between substrate loading stations of the facility. For example, the control system 123 may determine whether employing the selected carrier support to transfer the carrier from the first substrate loading station to the second substrate loading station may cause a delay in and/or failure of any pending carrier transfer between substrate loading stations of the facility.

If, in step 307, it is determined that employing the selected carrier support conflicts with a pending transfer, step 309 may be performed. In step 309, another carrier support may be selected from the plurality of carrier supports. More specifically, the control system 123 may select a remaining one of the carrier supports from the plurality of carrier supports. In some embodiments, the control system 123 may select the carrier support adjacent and upstream from the previously-selected carrier support on the moving conveyor system 101. However, in other embodiments, another carrier support may be selected from the plurality of carrier supports in a different manner. Thereafter, step 307 may be performed. As described above, in step 307 it may be determined whether employing the selected carrier support will conflict with a pending transfer. More specifically, the control system 123 may determine whether the other carrier support (e.g., a remaining one of the plurality of carrier supports) selected from the plurality of carrier supports will conflict with any pending carrier transfer between substrate loading stations.

Alternatively, if, in step 307, it is determined that employing the selected carrier support will not conflict with a pending transfer, step 311 may be performed. In step 311, the selected carrier support may be assigned for transferring the carrier from the first substrate loading station to the second substrate loading station. Because the control system 123 determines that employing the selected carrier support for the carrier transfer will not conflict with a pending transfer before assigning such carrier support, once assigned, the carrier support will transfer the carrier from the first substrate loading station to the second substrate loading station without conflicting with any pending transfers. For example, the carrier transfer using the assigned carrier support will not cause a delay in and/or failure of any pending transfers.

Thereafter, step 313 may be performed. In step 313, the method 301 ends.

In some embodiments, in addition to or as an alternative to step 307, it is determined whether employing the selected carrier support will unbalance the conveyor system 101. For example, it is determined whether employing the selected carrier support to transfer the carrier from the first substrate loading station to the second substrate loading station will overload one or more portions of the moving conveyor system 101, thereby potentially placing excessive stress on such portions.

In such embodiments, if it is determined employing the selected carrier support will unbalance the conveyor system 101, step 309 may be performed. As stated, in step 309 another carrier support from the plurality of carrier supports may be selected.

Alternatively, in such embodiments, if it is determined employing the selected carrier support will not unbalance the conveyor system 101, step 311 may be performed. As stated, in step 311, the selected carrier support may be assigned for transferring the carrier from the first substrate loading station to the second substrate loading station.

Through use of the method 301, one of a plurality of carrier supports may be assigned to transfer a carrier from the first substrate loading station to the second substrate loading station such that at least one of a time required for the transfer is reduced and balance of the conveyor system is maintained. Consequently, the control system 123 may cause a carrier to be transferred more efficiently and manufacturing throughput may be improved. For example, the TSC 117 may assign carrier supports for transferring carriers between substrate loading stations such that the following system-level requirements may be met: (1) when the assigned carrier support arrives at the first (e.g., source) substrate loading station, the source substrate loading station is ready to place a carrier onto the carrier support, and when the assigned carrier support arrives at the second (e.g., destination) substrate loading station, the destination substrate loading station is ready to remove the carrier from the carrier support; (2) the loading of carriers on the band 103 (e.g., onto assigned carrier supports coupled to the band 103) may not affect the ability of the TSC 117 to control the velocity of the band 103; and/or (3) the loading of the carriers on the band 103 (e.g., onto assigned carrier supports coupled to the band 103) may not affect the reliability of the band 103. In this manner, the TSC 117 may avoid situations which may adversely affect overall system throughput (e.g., of the conveyor system 101). For example, the TSC 117 may avoid a situation in which the destination substrate loading station (e.g., the substrate loading station that will receive the carrier) is not ready to remove the carrier from an assigned carrier support when the carrier support arrives at the substrate loading station, and therefore, the destination substrate loading station will be forced to wait for one complete revolution of the band 103 before such substrate loading station may remove the carrier from the band 103 because the carrier is already on the band 103, and a manufacturing execution system (MES), which may track carriers within the facility, has assigned the carrier to the destination substrate loading station. Further, the TSC 117 may avoid a situation in which the source substrate loading station (e.g., the substrate loading station that provides the carrier) is not ready to place the carrier onto an assigned carrier support when the carrier support arrives at the substrate loading station, and therefore, the transfer may have to be aborted, and thereafter, a new carrier support assigned for the transfer.

Additionally or alternatively, the TSC 117 may assign carrier supports such that the loading of carriers on the band 103 does not affect the ability of the TSC 117 to control the velocity of the band 103 to within, for example, 0.04% of a desired velocity (although a larger or smaller tolerance may be employed). Additionally or alternatively, the TSC 117 may assign carrier supports for supporting carriers such that the loading of the carriers on the band 103 is not uneven. Uneven loading of carriers on the band 103 may create stress, particularly at bends in the band 103, and may adversely affect the reliability of the band 103.

Figure 4:
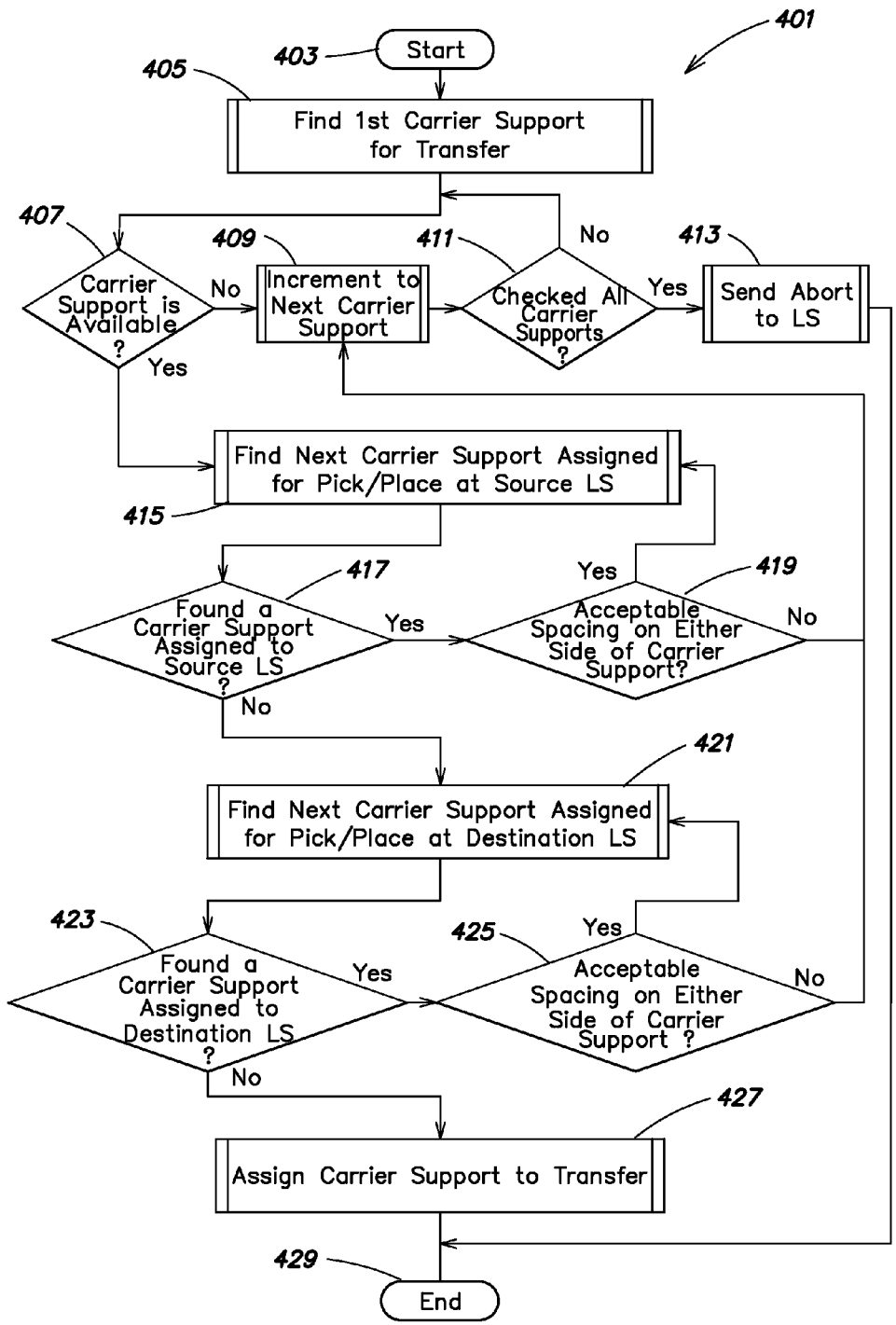
FIG. 4 illustrates a second exemplary method for assigning a carrier support when transferring a substrate carrier within the facility in accordance with an embodiment of the present invention.

FIG. 4 illustrates a second exemplary method for assigning a carrier support when transferring a substrate carrier within the facility in accordance with an embodiment of the present invention. With reference to FIG. 4, in step 403, the method 401 begins. In step 405, one of the plurality of carrier supports may be selected for transferring the carrier from a first substrate loading station to a second substrate loading station. For example, the control system 123 may select a first carrier support for the transfer. The control system 123 may select the first carrier support that may be employed for the transfer based on (1) the last carrier support to enter the first substrate loading station, (2) a maximum time required by the first substrate loading station after using a crane (e.g., to remove a carrier from or place a carrier onto the moving conveyor system 101) to reposition the crane to place a carrier onto the conveyor system 101, (3) a spacing between adjacent carrier supports on the conveyor system 101 and/or (4) a velocity of the conveyor system 101. In this manner, the control system 123 may select the first carrier support that will arrive at the first substrate loading station once the first substrate loading station is ready to place the desired carrier thereon (e.g., that will result in the first substrate loading station having to wait the least amount of time).

In step 407, it is determined whether the selected carrier support is available. A carrier support is available if the carrier support is (1) empty; and (2) not assigned for a transfer. A carrier support is empty if the carrier support is not supporting a carrier thereon. A carrier support is not assigned for a transfer if the control system 123 has not already assigned the carrier support to transfer a carrier between substrate loading stations of the facility. The availability of a carrier support may be based on a larger or smaller number of factors and/or different factors. For example, in some embodiments, a carrier support is available if the carrier support will be (1) empty; (2) not assigned for a transfer; and (3) acceptable to a band loading algorithm, all at the time the carrier support arrives at the intended substrate loading station for loading. The band loading algorithm may be employed by the control system 123 to maintain balance of the conveyor system 101. A carrier support may be acceptable to the band loading algorithm if employing the carrier support to transfer a carrier will not unbalance (e.g., unevenly load) the conveyor system 101. Employing a carrier support that is supporting a carrier thereon or a carrier support already assigned to transfer another carrier for the transfer may cause a delay in and/or failure of one or more transfers within the facility. Therefore, by determining whether the selected carrier support is available or will be available, the control system 123 may determine whether employing such carrier support will conflict with a pending transfer between substrate loading stations of the facility.

If, in step 407, it is determined the selected carrier support is not available, step 409 may be performed. In step 409, the control system 123 may select another carrier support. For example, the control system 123 may select the next adjacent carrier support (e.g., upstream) from the previously-selected carrier support. In this manner, the control system 123 may increment to the next carrier support of the plurality of carrier supports coupled to the conveyor system 101.

In step 411, it is determined whether all carrier supports in the plurality of carrier supports have been selected and determined to be unavailable. For example, the control system 123 may determine a previously-selected carrier support (e.g., the first carrier support that may be employed for the transfer) has been selected again. If, in step 411, the control system 123 determines all carrier supports have been selected and determined to be unavailable, no carrier supports in the plurality of carrier supports may be employed for the transfer. Therefore, step 413 may be performed. In step 413, a command to abort the transfer may be sent to the first substrate loading station. More specifically, because none of the carrier supports may currently be employed for the transfer, the control system 123 may abort the transfer. For example, the control system 123 may issue a request to transfer the carrier between the first substrate loading station and the second substrate loading station at later time.

Thereafter, step 429 may be performed. In step 429, the method 401 ends.

Alternatively, if, in step 411, it is determined that all carrier supports in the plurality of carrier supports have not been selected, step 407 may be performed. As stated, in step 407, it is determined whether the selected carrier support is available. More specifically, the control system 123 may determine whether the other carrier support selected in step 409 is available. In this manner, the control system 123 may increment through the plurality of carrier supports until an available carrier support is selected or the control system 123 determines no carrier supports are available for the transfer.

Alternatively, if, in step 407, it is determined the selected carrier support is available, step 415 may be performed. In step 415, the next carrier support assigned for a transfer at the first substrate loading station is identified. More specifically, each substrate loading station 115 (e.g., the first substrate loading station) may include a list of transfers pending at that substrate loading station 115. Each transfer pending at a substrate loading station may be a portion of a carrier transfer between substrate loading stations of the facility (e.g., place carrier X on carrier support X). The list may be stored in memory included in the substrate loading station 115. An entry in such list may represent a transfer pending at the substrate loading station and may include data such as a carrier support identification and task to be performed (e.g., whether a carrier is to be removed (e.g., picked) from the identified carrier support or placed onto the identified carrier support) by the substrate loading station. The control system 123 may traverse the list looking for a next entry corresponding to a carrier support assigned for a transfer at the first substrate loading station, such entry may represent the next carrier support assigned for a transfer onto which a carrier may be placed or from which the carrier may be removed by the substrate loading station.

In step 417, it is determined whether a next carrier support assigned for a transfer at the first substrate loading station is identified. More specifically, it is determined whether the control system 123 found an entry in the list included in the first substrate loading station.

If, in step 417, it is determined that a next carrier support assigned for a transfer at the first substrate loading station is identified, step 419 may be performed. In step 419, it is determined whether spacing on either side of the carrier support assigned for a transfer at the first substrate loading station remains acceptable if the selected carrier support is assigned for the transfer between the first and second substrate loading stations. The control system 123 may determine whether spacing on either side of the carrier support for a transfer at the first substrate loading station identified by the entry from the list remains acceptable if the selected carrier support is assigned for the transfer between the first and second substrate loading stations. Spacing may refer to a distance between adjacent carrier supports assigned for a transfer (e.g., a pick or place) at a substrate loading station. At the first substrate loading station, which may serve as a source substrate loading station for the selected carrier support, a value for acceptable spacing on either side of a carrier support may be calculated as follows:

If pick from the carrier support Then

1+round((BandVelocity/CarrierSupportSpacing*
 (MaximumPickTime+MaximumPrepareToPlace-
 Time)))

Else (must be a place to the carrier support)

1+round((BandVelocity/CarrierSupportSpacing*
 (MaximumPlaceTime+MaximumPrepare-
 ToPlaceTime)))

Endif
wherein:
 BandVelocity is the velocity of the conveyor system 101;
 CarrierSupportSpacing is the distance between adjacent carrier supports on the conveyor system 101;
 MaximumPickTime is a maximum time required by the substrate loading station to remove a carrier from a carrier support;
 MaximumPrepareToPlaceTime is a maximum time required by the substrate loading station to position itself to prepare to place a carrier on the conveyor system 101; and
 MaximumPlaceTime is a maximum time required by the substrate loading station to place a carrier onto the conveyor system 101.

Therefore, if the first substrate loading station will remove a carrier from the identified carrier support, the appropriate spacing on either side of such carrier support may be equal to 1+a product of the velocity of the conveyor system divided by the distance between adjacent carrier supports on the conveyor system and the sum of the maximum time required by the substrate loading station to remove a carrier from a carrier support and the maximum time required by the substrate loading station to position itself to prepare to place a carrier on the conveyor system rounded up (e.g., to an integer value).

Alternatively, if the first substrate loading station will place a carrier onto the identified carrier support, the appropriate spacing on either side of such carrier support may be equal to 1+a product of the velocity of the conveyor system divided by the distance between adjacent carrier supports on the conveyor system and the sum of the maximum time required by the substrate loading station to place a carrier onto a carrier support and the maximum time required by the substrate loading station to position itself to prepare to place a carrier on the conveyor system rounded up (e.g., to an integer value).

The control system 123 may employ the acceptable spacing value to determine whether spacing on either side of the carrier support identified for a transfer at the first substrate loading station (e.g., a carrier support identified in the list of pending transfers stored at the first substrate loading station) remains acceptable if the selected carrier (e.g., in step 405) support is assigned for the transfer between the first and second substrate loading stations. More specifically, the control system 123 may determine whether the selected carrier support is at least the number of carrier support spaces indicated by the acceptable spacing value away from the identified carrier support.

If the selected carrier support is less than the spacing indicated by the acceptable spacing value away from the identified carrier support, assigning the selected carrier support to transfer a carrier between the first and second substrate loading stations may cause a delay and/or failure of such transfer and/or cause a delay and/or failure of the identified carrier support's transfer at the first substrate loading station. For example, assigning such selected cradle may unbalance the band 103 which may cause a delay and/or failure of the transfer. Therefore, if, in step 419, it is determined that spacing on either side of the carrier support identified for a transfer at the first substrate loading station does not remain acceptable if the selected carrier support is assigned for the transfer between the first and second substrate loading stations, step 409 may be performed. As stated, in step 409, the control system 123 may select another carrier support.

However, if the selected carrier support is not less than the spacing indicated by the acceptable spacing value away from the identified carrier support, assigning the selected carrier support to transfer a carrier between the first and second substrate loading stations may not cause a delay and/or failure of such transfer and of the identified carrier support's transfer at the first substrate loading station. Therefore, if, in step 419, it is determined that spacing on either side of the carrier support identified for a transfer at the first substrate loading station remains acceptable if the selected carrier support is assigned for the transfer between the first and second substrate loading stations, step 415 and thereafter step 417 may be performed. As stated, in step 415, the next carrier support assigned for a transfer at the first substrate loading station is identified, and in step 417, it is determined whether a next carrier support assigned for a transfer at the first substrate loading station is identified.

Alternatively, if, in step 417, it is determined that a next carrier support assigned for a transfer at the first substrate loading station is not identified, the control system 123 may have traversed the entire list of pending transfers at the first substrate loading station. In this manner, the control system 123 may check all pending transfers at the first substrate loading station (e.g., all entries included in the list) and determine that the carrier support selected for transferring a carrier between the first and second substrate loading stations is acceptable to all pending transfers at the first substrate loading station. More specifically, the control system 123 may determine employing the selected carrier support to transfer a carrier between the first and second substrate loading stations will not cause delay and/or failure of any pending transfers at the first substrate loading station. Therefore, step 421 may be performed. In step 421, the next carrier support assigned for a transfer at the second substrate loading station is identified. As stated, each substrate loading station 115 may include a list of transfers pending at that substrate loading station 115. Each transfer pending at a substrate loading station may be a portion of a carrier transfer between substrate loading stations of the facility. The list may be stored in memory included in the substrate loading station 115. An entry in such list may represent a transfer pending at the substrate loading station and may include data such as a carrier support identification and task to be performed (e.g., whether a carrier is to be removed (e.g., picked) from the identified carrier support or placed onto the identified carrier support) by the substrate loading station. In the second substrate loading station, the control system 123 may traverse the list looking for a next entry corresponding to a carrier support assigned for a transfer at the second substrate loading station, which may represent the next carrier support assigned for a transfer onto which a carrier may be placed or from which the carrier may be removed by the second substrate loading station.

In step 423, it is determined whether a next carrier support assigned for a transfer at the second substrate loading station is identified. More specifically, it is determined whether the control system 123 found another entry in the list included in the second substrate loading station.

If, in step 423, it is determined that a next carrier support assigned for a transfer at the second substrate loading station is identified, step 425 may be performed. In step 425, it is determined whether spacing on either side of the carrier support identified for a transfer at the second substrate loading station remains acceptable if the selected carrier support is assigned for transferring a carrier between the first and second substrate loading stations. The control system 123 may determine whether spacing on either side of the carrier support for a transfer at the second substrate loading station identified by the entry from the list remains acceptable if the selected carrier support is assigned for the transfer between the first and second substrate loading stations. As stated, spacing may refer to a distance between adjacent carrier supports assigned for a transfer at a substrate loading station. At the second substrate loading station, which may serve as the destination substrate loading station for the selected carrier support, a value for acceptable spacing on either side of a carrier support may be calculated as follows:

If pick from the carrier support Then $$1+\text{round}((\text{BandVelocity}/\text{CarrierSupportSpacing}*(\text{MaximumPickTime}+\text{MaximumPrepareToPickTime})))$$

Else (must be a place to the carrier support)

$$1+\text{round}((\text{BandVelocity}/\text{CarrierSupportSpacing}*(\text{MaximumPlaceTime}+\text{MaximumPrepareToPickTime})))$$

Endif wherein MaximumPrepareToPickTime is a maximum time required by the substrate loading station to position itself to prepare to remove a carrier from the conveyor system.

Therefore, if the second substrate loading station will remove a carrier from the identified carrier support, the appropriate spacing on either side of such carrier support may be equal to 1+product of the velocity of the conveyor system divided by the distance between adjacent carrier supports on the conveyor system and the sum of the maximum time required by the substrate loading station to remove a carrier from a carrier support and the maximum time required by the substrate loading station to position itself to prepare to remove a carrier from the conveyor system rounded up (e.g., to an integer value).

Alternatively, if the second substrate loading station will place a carrier onto the identified carrier support, the appropriate spacing on either side of such carrier support may be equal to 1+product of the velocity of the conveyor system divided by the distance between adjacent carrier supports on the conveyor system and the sum of the maximum time required by the substrate loading station to place a carrier onto a carrier support and the maximum time required by the substrate loading station to position itself to prepare to remove a carrier from the conveyor system rounded up (e.g., to an integer value).

The control system 123 may employ the acceptable spacing value to determine whether spacing on either side of the carrier support identified for a transfer at the second substrate loading station remains acceptable if the selected carrier support is assigned for the transfer between the first and second substrate loading stations. More specifically, the control system 123 may determine whether the selected carrier support is at least the number of carrier support spaces indicated by the acceptable spacing value away from the identified carrier support.

If the selected carrier support is less than the spacing indicated by the acceptable spacing value away from the identified carrier support, assigning the selected carrier support to transfer a carrier between the first and second substrate loading stations may cause a delay and/or failure of such transfer and/or cause a delay and/or failure of the identified carrier support's transfer at the second substrate loading station. Therefore, if, in step 425, it is determined that spacing on either side of the carrier support identified for a transfer at the second substrate loading station does not remain acceptable if the selected carrier support is assigned for the transfer between the first and second substrate loading stations, step 409 may be performed. As stated, in step 409, the control system 123 may select another carrier support.

However, if the selected carrier support is not less than the spacing indicated by the acceptable spacing value away from the identified carrier support, assigning the selected carrier support to transfer a carrier between the first and second substrate loading stations may not cause a delay and/or failure of such transfer and of the identified carrier support's transfer at the second substrate loading station. Therefore, if, in step 425, it is determined that spacing on either side of the carrier support identified for a transfer at the second substrate loading station remains acceptable if the selected carrier support is assigned for the transfer between the first and second substrate loading stations, step 421 and thereafter step 423 may be performed. As stated, in step 421, the next carrier support assigned for a transfer at the second substrate loading station is identified, and in step 423, it is determined whether a next carrier support assigned for a transfer at the second substrate loading station is identified.

Alternatively, if, in step 423, it is determined that a next carrier support assigned for a transfer at the second substrate loading station is not identified, the control system 123 may have traversed the entire list of pending transfers at the second substrate loading station. In this manner, the control system 123 may check all pending transfers at the second substrate loading station included in the list and determine that the carrier support selected for transferring a carrier between the first and second substrate loading stations is acceptable to all pending transfers at the second substrate loading station. More specifically, the control system 123 may determine employing the selected carrier support to transfer a carrier between the first and second substrate loading stations will not cause delay and/or failure of any pending transfers at the second substrate loading station.

In this manner, the control system 123 may determine that employing the selected carrier support to transfer a carrier between the first and second substrate loading stations will not cause delay and/or failure of any pending transfers at the first and second substrate loading stations. Therefore, step 427 may be performed. In step 427, the selected carrier support may be assigned to transfer a carrier between the first and second substrate loading stations. The list corresponding to the first substrate loading station may be updated to include an entry identifying the selected carrier support and indicating the first substrate loading station will place a carrier onto the selected carrier support. Similarly, the list corresponding to the second substrate loading station may be updated to include an entry identifying the selected carrier support and indicating the second substrate loading station will remove a carrier from the selected carrier support.

Thereafter, step 429 may be performed. As stated, in step 429, the method 401 ends. Through use of the method 401 one of the plurality of carrier supports may be assigned to transfer the carrier from a first substrate loading station to a second substrate loading station such that a time required for the transfer is reduced and/or balance of the conveyor system is maintained. For example, by starting at the first possible carrier support that may be available for the transfer, and by selecting an empty carrier support that is not already assigned to a transfer and that will not conflict with any pending transfers at the first and second substrate loading stations, the present methods and apparatus may assign one of the plurality of carrier supports to transfer the carrier from a first substrate loading station to a second substrate loading station such that a time required for the transfer is reduced. Additionally or alternatively, by only assigning carrier supports that are acceptable to the band loading algorithm, the present methods and apparatus may assign one of the plurality of carrier supports to transfer the carrier from a first substrate loading station to a second substrate loading station such that balance of the conveyor system is maintained.

Figure 5:
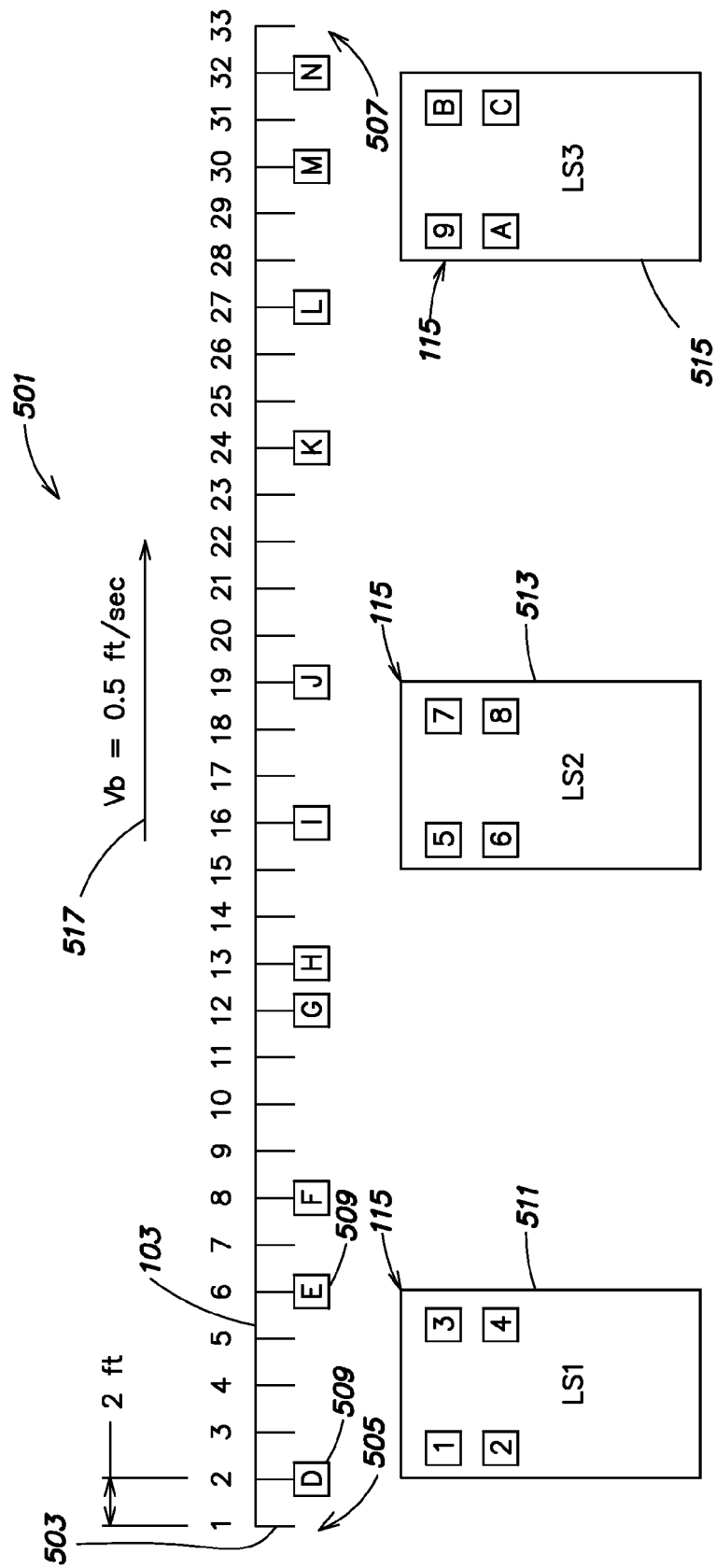
FIG. 5 is a block diagram of an exemplary apparatus for transferring a substrate carrier within the facility during operation in accordance with an embodiment of the present invention.

A method for transferring a substrate carrier within the facility which employs the second exemplary method for assigning a carrier support when transferring a substrate carrier within the facility is described below with reference to FIGS. 2 and 4 and with reference to FIG. 5 which is a block diagram of an exemplary apparatus for transferring a substrate carrier within the facility during operation in accordance with an embodiment of the present invention. With reference to FIG. 5, the apparatus 501 may be a moving conveyor system that includes a band 113. The apparatus may include thirty-three carrier supports, adapted to support a respective carriers, coupled to the band 113 (although a larger or smaller number of carrier supports may be employed). The band 103 may be continuous. For example, a first end 505 of the band 103 may be coupled to a second end 507 of the band 103 at a known point along the band 103 known as the "0th" carrier support. The 0th carrier support of the band 103 is between the first and thirty-third carrier supports 503 (although the 0th carrier support may be located elsewhere along the band 113). The apparatus 501 may move one or more carriers 509 above a plurality of substrate loading stations. For example, the apparatus 501 may move carriers above a first through third substrate loading station 511-515 (although the apparatus 501 may move the carriers above a larger or smaller number of substrate loading stations 511-515. For the apparatus 501, a maximum time required by a substrate loading station 511-515 to position itself to prepare to place a carrier 509 onto the conveyor system 501, a maximum time required by the substrate loading station 511-515 to position itself to prepare to remove a carrier 509 from the conveyor system 501, a maximum time required to remove a carrier 509 from the conveyor system 501 and a maximum time required to place a carrier 509 onto the conveyor system 501 is six seconds for each substrate loading station. However, a larger or smaller value may be employed for any of the above parameters for one or more of the substrate loading stations 511-515. Further, the velocity of the band 113 may be 0.5 feet/second in the direction of the arrow 517 (e.g., from the first substrate loading station 511 toward the third substrate loading station 515). The space between adjacent carrier supports 503 on the band 103 may be two feet. However, a larger or smaller value may be employed for the band velocity and/or space between adjacent carrier supports.

Further, the following transfers are assumed pending:
Scheduled Transfers (e.g., Picks and Places)
At Substrate loading station 1 (SLS1)

| Picks | Places |
| --- | --- |
| Carrier M from Carrier support 30 | Carrier 3 to Carrier support 5 |

At Substrate loading station 2 (SLS2)

| Picks | Places |
| --- | --- |
| Carrier G from Carrier support 12 | Carrier 7 to Carrier support 18 |

At Substrate loading station 3 (SLS3)

| Picks | Places |
| --- | --- |
| Carrier K from Carrier support 24 | 38 Carrier B to Carrier support 11. |

During operation, for example, during step 205, the TSC 117 of the control system 123 may receive a new Transfer command from the MCS 121 to move Carrier 4 from SLS1 to SLS2. In response, the first substrate loading station SLS1 may send an AssignCarrier support command to the TSC 117 which may indicate that the last carrier support to enter the first substrate loading station SLS1 was Carrier support 3. Details of the handshaking between the components of the control system 123 and/or one or more substrate loading stations 511-515 are described below with reference to FIGS. 6 and 7. Thereafter, during step 207 in which the second exemplary method 401 may be employed, the following process flow may occur:

1. In step 405, using the formulas described above, the control system 123 may determine the first substrate loading station (e.g., source substrate loading station) may require a spacing of four carrier supports on either side of a carrier support already assigned for a pick or a place.
2. The TSC 117 may assume that the first substrate loading station (e.g., SLS1) requires this four carrier support spacing from the last carrier support (e.g., Carrier support 3) that entered the first substrate loading station. Therefore, the TSC 117 starts with Carrier support 33 as the first carrier support that may possibly be used for the transfer. It should be noted the 0th carrier support, while not available to use for transfers, may be taken into account when determining carrier support spacing (although, in some embodiments, the 0th carrier support may not be counted when determining carrier support spacing).
3. In step 407, is Carrier support 33 available (empty, not assigned to another transfer and acceptable to the band loading algorithm)? Yes.
4. In steps 415-417, the first carrier support assigned to a transfer at the first substrate loading station SLS1 is Carrier support 30.
5. In step 419, is Carrier support 33 acceptable to the first substrate loading station SLS1, given that Carrier support 30 is assigned for a transfer? No, because Carrier support 33 is not at least 4 spaces from Carrier support 30.
6. After steps 409 and 411, in step 407, is Carrier support 32 available (empty, not assigned to another transfer and acceptable to the band loading algorithm)? No.
7. After steps 409 and 411, in step 407, is Carrier support 31 available (empty, not assigned to another transfer and acceptable to the band loading algorithm)? Yes.
8. After steps 415-417, the first carrier support assigned to a transfer at the first substrate loading station SLS1 is Carrier support 30.
9. In step 419, is Carrier support 31 acceptable to the first too station SLS1, given that Carrier support 30 is assigned for a transfer? No, because Carrier support 31 is not at least four spaces from Carrier support 30.
10. After steps 409 and 411, in step 407, is Carrier support 30 available (empty, not assigned to another transfer and acceptable to the band loading algorithm)? No.
11. After steps 409 and 411, in step 407, is Carrier support 29 available (empty, not assigned to another transfer and acceptable to the band loading algorithm)? Yes.
12. In steps 415-417, the first carrier support assigned to a transfer at the first substrate loading station SLS1 is Carrier support 30.
13. In step 419, is Carrier support 29 acceptable to the first substrate loading station SLS1, given that Carrier support 30 is assigned for a transfer? No.
14. This process may continue until the TSC 117 gets to Carrier support 26.
15. In step 419, is Carrier support 26 acceptable to the first substrate loading station SLS1, given that Carrier support 30 is assigned for a transfer? Yes.
16. In steps 415-417, the next carrier support assigned to a transfer at the first substrate loading station SLS1 is Carrier support 5.
17. In step 419, is Carrier support 26 acceptable to the first substrate loading station SLS1, given that Carrier support 5 is assigned for a transfer? Yes.
18. In step 417, no more carrier supports assigned to transfers at the first substrate loading station SLS1, so Carrier support 26 is acceptable to the first (e.g., source) substrate loading station.
19. Using the formulas described above, the second (e.g., destination) substrate loading station SLS2 may require a spacing of four carrier supports on either side of a carrier support already assigned for a pick or a place.

20. In steps 421-423, the first carrier support assigned to a transfer at the second substrate loading station SLS2 is Carrier support 12.
21. In step 425, is Carrier support 26 acceptable to the second substrate loading station SLS2, given that Carrier support 12 is assigned for a transfer? Yes.
22. In steps 421-423, the next carrier support assigned to a transfer at the second substrate loading station SLS2 is Carrier support 18.
23. In step 425, is Carrier support 26 acceptable to the second substrate loading station SLS2, given that Carrier support 18 is assigned for a transfer? Yes.
24. In step 423, no more carrier supports assigned to transfers at the second substrate loading station SLS2, so Carrier support 26 is acceptable to the second (e.g., destination) substrate loading station.
25. In step 427, Carrier support 26 is assigned to this transfer.
26. In step 209, Carrier support 26 may move a carrier from the first (e.g., source) substrate loading station. More specifically, the first substrate loading station SLS1 may place the carrier onto Carrier support 26 and Carrier support 26 may move the carrier from the first substrate loading station SLS1.
27. In step 211, Carrier support 26 may move the carrier to the second (e.g., destination) substrate loading station. More specifically, Carrier support 26 may move the carrier to the second substrate loading station SLS2 and the second substrate loading station SLS2 may remove the carrier from Carrier support 26.

In this manner, the apparatus 501 may transfer a substrate carrier within the facility by employing an exemplary method for assigning a carrier support when transferring the carrier within the facility such that a time required for the transfer is reduced and/or balance of the conveyor system is maintained. Consequently, the control system 123 may cause a carrier to be transferred more efficiently than in conventional electronic device manufacturing systems, thereby improving manufacturing throughput compared to conventional systems.

Figure 6:
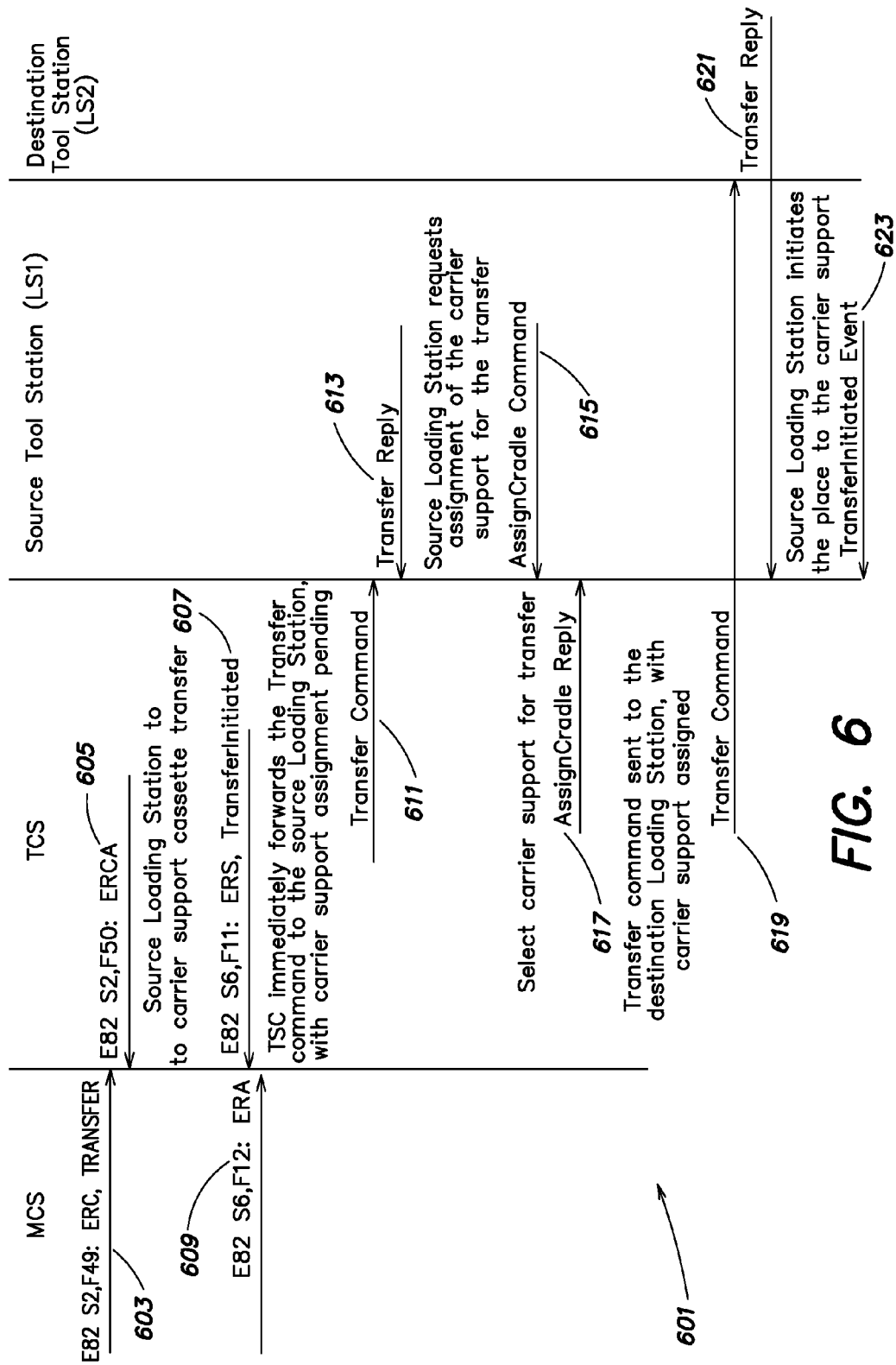
FIG. 6 illustrates handshaking while initiating a substrate carrier transfer within the facility in which a carrier support is successfully assigned in accordance with an embodiment of the present invention.

FIG. 6 illustrates handshaking 601 while initiating a substrate carrier transfer within the facility in which a carrier support is successfully assigned in accordance with an embodiment of the present invention. With reference to FIG. 6, to initiate a carrier transfer within the facility, the MCS 121 may issue a command 603 to transfer a specified carrier from a source substrate loading station (e.g., SLS1) to a destination substrate loading station (e.g., SLS2). The TSC 117 may issue a response 605 to the MCS command 603. The TSC 117 will attempt to transfer the specified carrier from the source substrate loading station to a carrier support. For example, the TSC 117 may send a notification 607 to the MCS 121 that the transfer is initiated to which the MCS may issue a response 609.

The TSC 117 may issue a command 611 to transfer the carrier to the source substrate loading station SLS1 with a pending carrier support assignment. For example, the TSC 117 may forward the command received from the MCS 603 to the source substrate loading station SLS1. The source substrate loading station SLS1 may issue a reply 613 to the transfer command 611. Because the carrier support assignment is pending in transfer command 611 received by the source substrate loading station SLS1, the source substrate loading station SLS1 may issue a command 615, which requests assignment of a carrier support to be employed for the transfer, to the TSC 117. The command 615 requesting assignment of a carrier support to be employed for the transfer may include information such as the last carrier support to enter the source substrate loading station SLS1. The command 615 may include additional and/or different information. Based on information such as the last carrier support to enter the source substrate loading station SLS1, the TSC 117 may employ one of the exemplary methods 301, 401 for assigning a carrier support when transferring a substrate carrier within the facility described above to select and assign a carrier support for the transfer. The TSC 117 may issue a reply 617 to the source substrate loading station SLS1, which may identify the carrier support selected and assigned for the transfer.

The TSC 117 may issue a transfer command 619 to the destination substrate loading station SLS2, which may include the carrier support selected and assigned for the transfer. The destination substrate loading station SLS2 may issue a reply 621 to the TSC 117 in response the transfer command 619. The source substrate loading station SLS1 may then initiate a transfer to move the specified carrier from the source substrate loading station SLS1 to the assigned carrier support. In this manner, the source substrate loading station SLS1 may place the specified carrier onto the assigned carrier support. The source substrate loading station SLS1 may send an event notification 623 to the TSC 117 that the transfer is initiated.

Figure 7B:
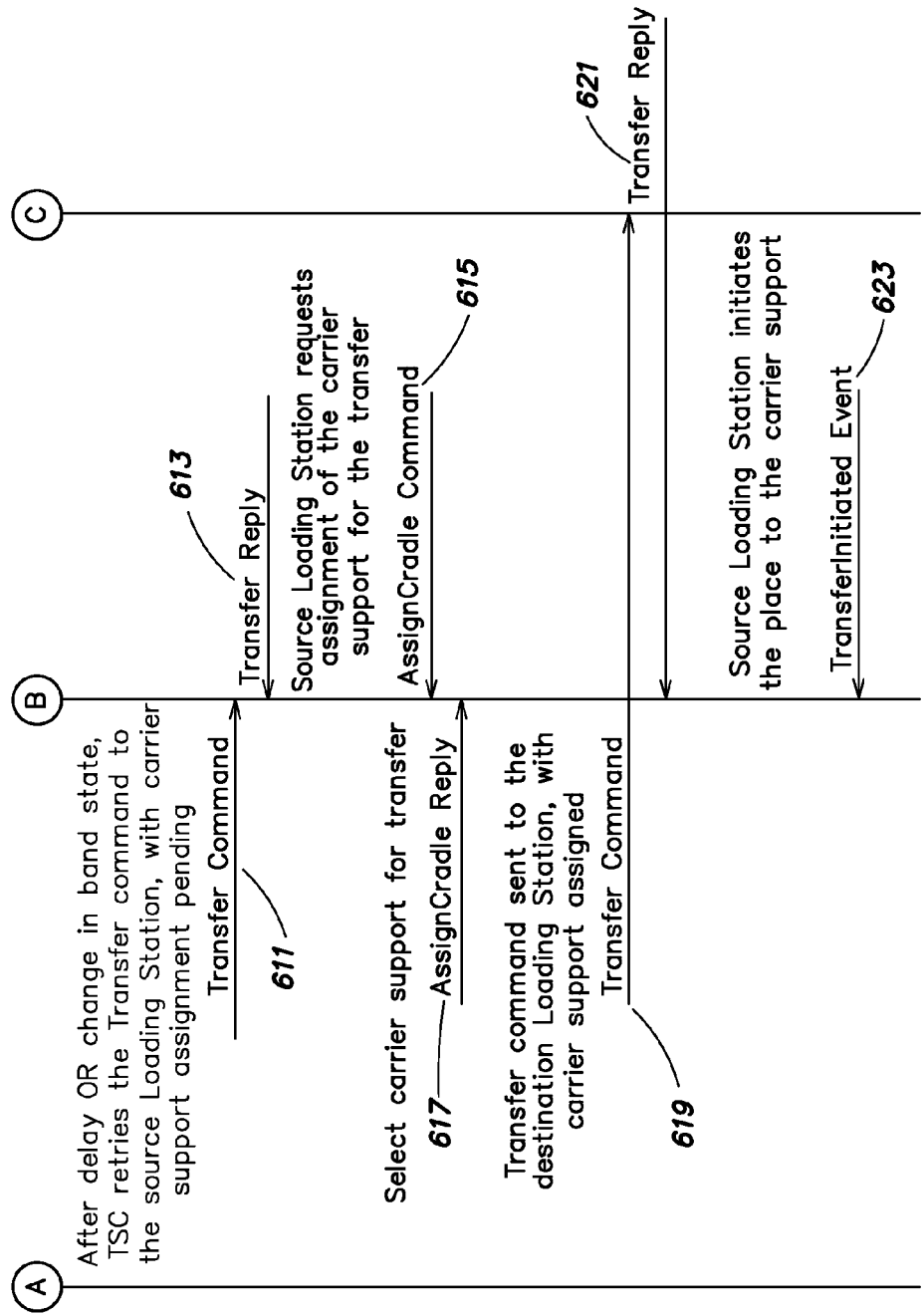

The handshaking 601 of FIG. 6 illustrates initiation of a transfer in which a carrier support is successfully assigned. In contrast, FIGS. 7A and 7B illustrate handshaking 701 while initiating a substrate carrier transfer within the facility in which a carrier support is unsuccessfully assigned in accordance with an embodiment of the present invention. With reference to FIGS. 7A and 7B, communications (e.g., commands, responses, notifications and/or replies) 603-615 included in handshaking 701 are similar to those in the handshaking 601 of FIG. 6, and therefore, are not described in detail herein. In contrast to handshaking 601, during handshaking 701, in response to a command 615 to assign a carrier support for the transfer from the source substrate loading station SLS1 to the TSC 117, the TSC 117 unsuccessfully attempts to assign a carrier support. It should be noted that such condition is an anomaly. More specifically, based on information such as the last carrier support to enter the source substrate loading station SLS1, the TSC 117 may employ one of the exemplary methods 301, 401 for assigning a carrier support when transferring a substrate carrier within the facility described above to select and assign a carrier support for the transfer. However, such exemplary methods 301, 401 are unable to select and assign a carrier support acceptable to both the source and destination substrate loading stations SLS1, SLS2 such that at least one of a time required for the transfer is reduced and balance of the conveyor system is maintained. Therefore, the TSC 117 may issue a reply 703 to the source substrate loading station SLS1 indicating that the TSC 117 is unable to assign a carrier support for the transfer. Further, the TSC 117 may issue a command 705 to the source substrate loading station SLS1 to cancel the transfer. The source substrate loading station SLS1 may issue a reply 707 to the TSC 117 in response to the command 705 to cancel the transfer.

The source substrate loading station SLS1 may cancel the transfer command and send an event notification 709 to the TSC 117 that the cancellation of the transfer command has initiated. Thereafter, once the transfer command is cancelled, the source substrate loading station SLS1 may send an event notification to the TSC 117 that the cancellation of the transfer command is complete.

The TSC 117 may wait a time, which may be specified as a delay (e.g., a configurable delay) or wait for the status (e.g., availability) of one or more carrier supports to change such that the TSC 117 may successfully assign (or reasonably expect to successfully assign) a carrier support. Thereafter, the TSC 117 will reissue the command 611 to transfer the carrier to the source substrate loading station SLS1 with a pending carrier support assignment. The following communications (e.g., commands, responses, notifications and/or replies) 613-623 included in handshaking 701 are similar to those corresponding communications in the handshaking 601 of FIG. 6, and therefore, are not described in detail herein. In this manner, although the control system 123 is initially unable to assign a carrier support in response a command to transfer a carrier from the source substrate loading station SLS1 to the destination substrate loading station SLS2, the control system 123 may later reissue the transfer command and successfully assign a carrier support for the transfer. The handshaking illustrated in FIGS. 6 and 7 is exemplary, and therefore, it should be understood that the handshaking may occur in a different manner. For example, the handshaking 601, 701 may include a larger or smaller number of communications. Further, the handshaking may include different communications 601, 701.

In this manner, the present methods and apparatus may, for example, optimize selection of a carrier support for a carrier transfer such that (1) a time required for acquiring the carrier is reduced and/or minimized; and/or (2) a distribution of carriers on the band 103 generally does not result in velocity variations along the band 103. More specifically, before selecting a carrier support for a carrier transfer, the TSC 117 may obtain data from the source substrate loading station SLS1 such as the last carrier support to arrive at the source substrate loading station SLS1, a time (e.g., estimated time) for the source substrate loading station SLS1 to prepare itself (e.g., a crane of the source substrate loading station SLS1) for the carrier transfer. Additionally or alternatively, by ensuring the distribution of carriers on the band 103 generally does not result in velocity variations along the band 103, the present methods and apparatus may lessen uneven loading of the band 103 which may create stresses resulting in band compression and/or expansion, particularly at bends in the band.

The foregoing description discloses only exemplary embodiments of the invention. Modifications of the above disclosed apparatus and methods which fall within the scope of the invention will be readily apparent to those of ordinary skill in the art. For instance, although the present methods and apparatus describe assigning one of the plurality of carrier supports to transfer a carrier from a first substrate loading station (e.g., SLS1) to a second substrate loading station (e.g., SLS2) such that at least one of a time required for the transfer is reduced and balance of the conveyor system is maintained, in other embodiments, carrier supports may be assigned to transfer a carrier from a first substrate loading station to a second substrate loading station such that other advantages which may optimize the carrier transfer are achieved. It will be understood that the invention also may be employed with any type of substrates such as a silicon substrate, a glass plate, a mask, a reticule, a wafer, etc., whether patterned or unpatterned; and/or with apparatus for transporting and/or processing such substrates.

Accordingly, while the present invention has been disclosed in connection with exemplary embodiments thereof, it should be understood that other embodiments may fall within the spirit and scope of the invention, as defined by the following claims.

The invention claimed is:

1. A method of electronic device manufacturing, comprising:
    receiving a request to transfer a carrier to or from a first substrate loading station of an electronic device manufacturing facility including a plurality of substrate loading stations, wherein the facility further includes a plurality of carrier supports coupled to a conveyor system adapted to move carriers within the facility; and
    assigning one of the plurality of carrier supports to carry out the transfer based on a spacing on either side of the assigned carrier of the plurality of carrier supports being greater than an acceptable spacing.

2. The method of claim 1 wherein if the spacing is greater than the acceptable value then the transfer is carried out.

3. The method of claim 1 wherein if the spacing is less than the acceptable value then another carrier is assigned for the transfer.

4. The method of claim 1 wherein assigning one of the plurality of carrier supports to carry out the transfer includes:
    assigning one of the plurality of carrier supports; and
    determining whether employing the assigned carrier support will conflict with a pending transfer.

5. The method of claim 4 wherein if a conflict exists with a pending transfer, another one of the plurality of carrier supports is assigned.

6. The method of claim 1 wherein if the first substrate loading station will remove a carrier from the assigned carrier support, the acceptable spacing on either side of the assigned carrier support may be equal to 1+a product of a velocity of the conveyor system divided by a distance between adjacent carrier supports on the conveyor system and a sum of a maximum time required by the first substrate loading station to remove a carrier from a carrier support and a maximum time required by the first substrate loading station to position itself to prepare to place a carrier on the conveyor system rounded up to an integer value.

7. The method of claim 1 wherein if the first substrate loading station will place a carrier onto the assigned carrier support, the acceptable spacing on either side of the first carrier support may be equal to 1+a product of a velocity of the conveyor system divided by a distance between adjacent carrier supports on the conveyor system and a sum of a maximum time required by the first substrate loading station to place a carrier onto a carrier support and a maximum time required by the first substrate loading station to position itself to prepare to place a carrier on the conveyor system rounded up to an integer value.

8. The method of claim 1 wherein the request is to transfer a carrier from the first substrate loading station to a second substrate loading station on the assigned carrier support.

9. The method of claim 1 wherein the request to transfer the carrier to or from the substrate loading station is generated from a list of substrate transfers pending at the first substrate loading station.

10. A method of electronic device manufacturing, comprising:
    selecting a carrier support to transfer a carrier to or from a substrate loading station of an electronic device manufacturing facility including a plurality of carrier supports coupled to a conveyor system and adapted to move carriers within the facility, wherein the step of selecting the carrier support to carry out the transfer is based on an acceptable spacing between adjacent carrier supports.

11. A method of electronic device manufacturing, comprising:
    assigning a carrier support to transfer a carrier from a first substrate loading station to a second substrate loading station of an electronic device manufacturing facility including a plurality of carrier supports coupled to a conveyor system and adapted to move carriers within the facility;

determining whether a spacing on either side of the assigned carrier support of the plurality of carrier supports is greater than an acceptable spacing; and if so transferring the carrier on the assigned carrier.

12. An apparatus for electronic device manufacturing, comprising:
- a control system of an electronic device manufacturing facility adapted to:
  - issue a request to transfer a carrier to or from a substrate loading station, wherein the facility further includes a plurality of carrier supports coupled to a conveyor system adapted to move carriers within the facility;
  - assign one of the plurality of carrier supports to carry out the transfer of the carrier; and
  - verify whether a spacing on either side of the assigned carrier support of the plurality of carrier supports is greater than an acceptable spacing.

13. The apparatus of claim 12 wherein the control system includes a transport system controller for assigning carrier supports and for monitoring a status of carrier supports.

14. The apparatus of claim 12 wherein the assigned carrier support comprises a cradle adapted to receive the carrier.

15. The apparatus of claim 12 wherein the control system is adapted to control an operation of a band of the conveyor system to which the assigned carrier support is coupled.

16. The apparatus of claim 15 wherein the control system is adapted to control a velocity of the band.

17. The apparatus of claim 12 wherein the transfer of the carrier is between a first substrate loading station and a second substrate loading station.

18. The apparatus of claim 12 wherein the control system is adapted to determine whether employing the assigned carrier support will conflict with any pending carrier transfer.

19. The apparatus of claim 12 wherein the transfer is from a first substrate loading station and a second substrate loading station and the control system is adapted to cause a second substrate loading station to be ready to remove the carrier upon arrival of the carrier at second substrate loading station.

20. The apparatus of claim 12 wherein the control system is adapted to cause the transfer to occur such that a velocity of a moving band of the conveyor system carrying the assigned carrier support is substantially matched by a speed of the carrier being loaded.

* * * * *